United States Patent
Cheng et al.

(10) Patent No.: US 11,869,761 B2
(45) Date of Patent: Jan. 9, 2024

(54) BACK-SIDE DEEP TRENCH ISOLATION STRUCTURE FOR IMAGE SENSOR

(71) Applicant: Taiwan Semiconductor Manufacturing Co., Ltd., Hsin-Chu (TW)

(72) Inventors: Yu-Hung Cheng, Tainan (TW); Chun-Tsung Kuo, Tainan (TW); Jiech-Fun Lu, Madou Township (TW); Min-Ying Tsai, Kaohsiung (TW); Chiao-Chun Hsu, Hsin-Chu (TW); Ching I Li, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 234 days.

(21) Appl. No.: 17/017,854

(22) Filed: Sep. 11, 2020

(65) Prior Publication Data

US 2021/0335861 A1    Oct. 28, 2021

Related U.S. Application Data

(60) Provisional application No. 63/014,856, filed on Apr. 24, 2020.

(51) Int. Cl.
*H01L 27/146*     (2006.01)
*H01L 21/02*      (2006.01)
*H01L 21/306*     (2006.01)

(52) U.S. Cl.
CPC .... *H01L 27/1463* (2013.01); *H01L 21/02057* (2013.01); *H01L 21/30604* (2013.01);
(Continued)

(58) Field of Classification Search
CPC ........... H01L 27/1463; H01L 21/02057; H01L 21/30604; H01L 27/14683;
(Continued)

(56) References Cited

U.S. PATENT DOCUMENTS 9,899,441 B1 * 2/2018 Cheng ............... H01L 27/14627
2010/0327349 A1 * 12/2010 Arie .................. H01L 29/66659
257/E29.256

(Continued)

FOREIGN PATENT DOCUMENTS

CN    108231814 A  *  6/2018   ......... H01L 27/1463
JP    2003151965 A      5/2003

*Primary Examiner* — Aaron J Gray
(74) *Attorney, Agent, or Firm* — Eschweiler & Potashnik, LLC

(57) ABSTRACT

The present disclosure relates to an image sensor having a photodiode surrounded by a back-side deep trench isolation (BDTI) structure, and an associated method of formation. In some embodiments, a plurality of pixel regions is disposed within an image sensing die and respectively comprises a photodiode configured to convert radiation into an electrical signal. The photodiode comprises a photodiode doping column with a first doping type surrounded by a photodiode doping layer with a second doping type that is different than the first doping type. A BDTI structure is disposed between adjacent pixel regions and extending from the back-side of the image sensing die to a position within the photodiode doping layer. The BDTI structure comprises a doped liner with the second doping type and a dielectric fill layer. The doped liner lines a sidewall surface of the dielectric fill layer.

20 Claims, 19 Drawing Sheets

(52) U.S. Cl.
CPC .... *H01L 27/1469* (2013.01); *H01L 27/14634* (2013.01); *H01L 27/14683* (2013.01); *H01L 27/14698* (2013.01); *H01L 27/1464* (2013.01); *H01L 27/14636* (2013.01)

(58) Field of Classification Search
CPC ......... H01L 27/14698; H01L 27/14634; H01L 27/1469; H01L 27/1464
See application file for complete search history.

(56) References Cited

U.S. PATENT DOCUMENTS

| | | | |
|---|---|---|---|
| 2011/0108939 A1* | 5/2011 | Marty | H01L 27/1464 257/E31.097 |
| 2013/0171766 A1* | 7/2013 | Lin | H01L 27/1464 257/E31.11 |
| 2015/0115388 A1* | 4/2015 | Eda | H01L 27/1463 257/446 |
| 2015/0243694 A1* | 8/2015 | Ihara | H01L 27/14621 257/443 |
| 2015/0279894 A1 | 10/2015 | Cheng et al. | |
| 2017/0062496 A1* | 3/2017 | Lai | H01L 27/1464 |
| 2017/0062512 A1 | 3/2017 | Chou et al. | |
| 2017/0110494 A1 | 4/2017 | Tsai et al. | |
| 2017/0278893 A1* | 9/2017 | Cheng | H05K 999/99 |
| 2018/0182790 A1 | 6/2018 | Yamaguchi | |
| 2019/0096929 A1* | 3/2019 | Chiang | H01L 27/14612 |
| 2019/0165009 A1 | 5/2019 | Wu et al. | |
| 2020/0066768 A1 | 2/2020 | Cheng et al. | |

\* cited by examiner

BACK-SIDE DEEP TRENCH ISOLATION STRUCTURE FOR IMAGE SENSOR

REFERENCE TO RELATED APPLICATION

This Application claims the benefit of U.S. Provisional Application No. 63/014,856, filed on Apr. 24, 2020, the contents of which are hereby incorporated by reference in their entirety.

BACKGROUND

Many modern day electronic devices comprise optical imaging devices (e.g., digital cameras) that use image sensors. An image sensor may include an array of pixel sensors and supporting logic. The pixel sensors measure incident radiation (e.g., light) and convert to digital data, and the supporting logic facilitates readout of the measurements. One type of image sensor is a backside illuminated (BSI) image sensor device. BSI image sensor devices are used for sensing a volume of light projected towards a back-side of a substrate (which is opposite to a front-side of the substrate where interconnect structures including multiple metal and dielectric layers are built thereon). BSI image sensor devices provide a reduced destructive interference, as compared to front-side illuminated (FSI) image sensor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
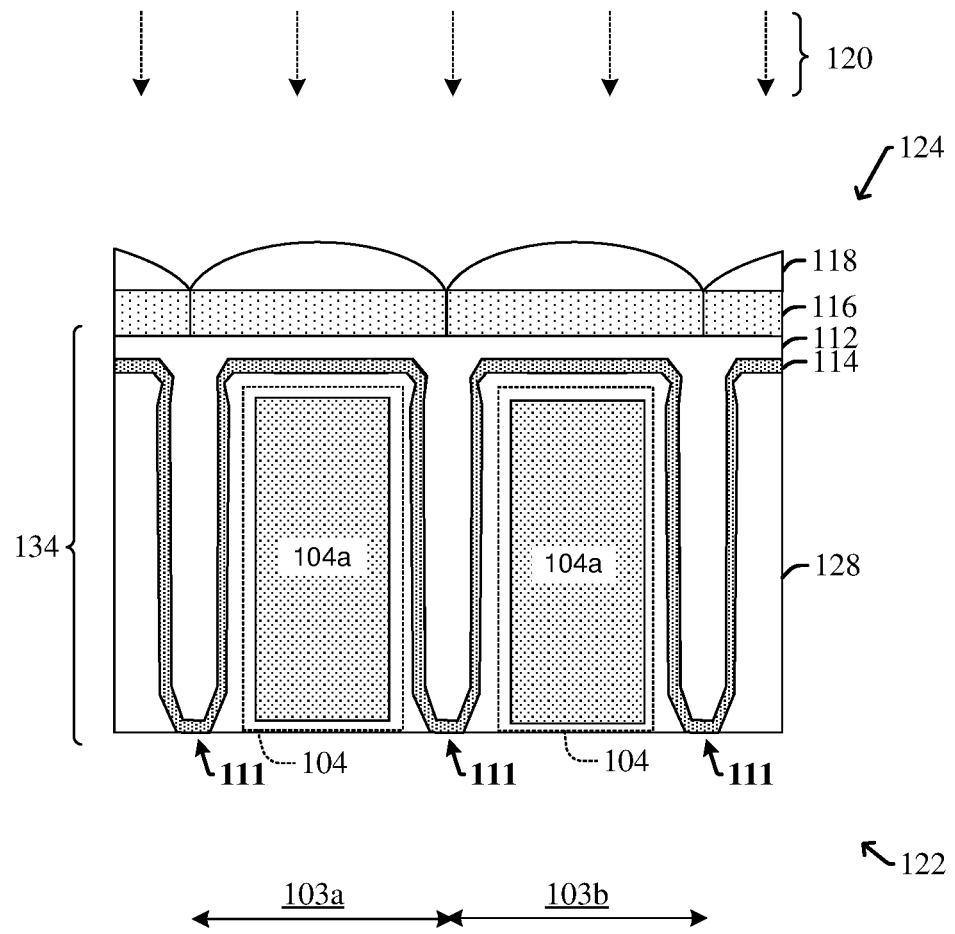
FIG. 1 illustrates a cross-sectional view of some embodiments of an image sensor comprising a photodiode surrounded by a back-side deep trench isolation (BDTI) structure with a doped liner.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. Due to device scaling, pixel sensors of an image sensor have smaller dimensions and are closer to one another. An improved electrical and optical isolation between neighboring pixels of the image sensor is needed in order to reduce blooming and crosstalk. Dielectric trenches and implantation wells can be fabricated as isolation structures to isolate image sensor pixels. One kind of image sensor fabrication processes includes an implantation process to form deep implant wells through the depth of the photodiode as isolation walls (e.g., an implantation process known as array deep p-well implantation). However, besides fabrication complexity, these implantation processes involve a thick photoresist layer which reduces exposure resolution. For example, if the critical dimension is smaller than 0.2 μm, a precise lithography process is hardly achievable with a photoresist layer greater than 3 μm.

In view of the above, the present disclosure relates to an image sensor comprising a back-side deep trench isolation (BDTI) structure with a doped liner, and an associated method of formation. In some embodiments, the image sensor has a plurality of pixel regions disposed within an image sensing die. The pixel regions respectively have a photodiode configured to convert radiation into an electric signal. The photodiode includes a photodiode doping column with a first doping type surrounded by a photodiode doping layer with a second doping type that is different than the first doping type. A BDTI structure is disposed between adjacent pixel regions and extends from a back-side of the image sensing die to a position within the photodiode doping layer. The BDTI structure comprises a doped liner with the second doping type lining a sidewall surface of a deep trench of the photodiode doping layer and a filling layer disposed in remaining inner space of the deep trench. With the BDTI structure extending deeply and functioned as the deep depletion and isolation structure between neighboring pixels, no deep implantation from a front-side of the sensing die is needed.

In addition, in some embodiments, a cyclic cleaning process is performed after forming the deep trench and before forming the doped liner in the deep trench, such that a defective upper portion of the photodiode doping layer exposing to the deep trench and a bowing tip at top corner of the deep trench are removed or at least reduced, leaving a smooth sidewall surface and a less bowing neck for the deep trench. As a result, a smooth and uniform filling result can be more easily achieved during subsequent trench filling processes. In some further embodiments, the doped liner is formed by a low temperature epitaxial process followed by a laser annealing process for dopant activation. Thereby, without introducing unwanted extraordinary heat budget, the doped liner is formed in conformal, smoothly, and with less defects. More details of some embodiments of the methods of forming the doped liner are described below associated with FIGS. 2A-2D and FIGS. 13-15 of manufacturing process illustration.

FIG. 1 illustrates a cross-sectional view of an image sensor 100 having a photodiode 104 surrounded by a BDTI structure 111 with a doped liner 114 according to some embodiments. The image sensing die 134 has a front-side 122 and a back-side 124. The image sensor 100 comprises an image sensing die 134 having a plurality of pixel regions that may be arranged in an array comprising rows and/or columns, such as pixel regions 103a, 103b shown in FIG. 1. The pixel regions 103a, 103b respectively comprises the photodiode 104 configured to convert incident radiation or incident light 120 (e.g., photons) into an electric signal. In some embodiments, the photodiode 104 comprises a first region such as a photodiode doping column 104a having a first doping type (e.g., n-type doping by dopants such as phosphorus, arsenic, antimony, etc.) and an adjoining second region such as a photodiode doping layer 128 having a second doping type (e.g., p-type doping by dopants such as boron, aluminum, indium, etc.) that is different than the first doping type.

The BDTI structure 111 is disposed between and isolate adjacent pixel regions 103a, 103b. The BDTI structure 111 may extends from the back-side 124 of the image sensing die 134 to a position within the photodiode doping layer 128 or extend through the photodiode doping layer 128 as shown in FIG. 1. In some embodiments, the BDTI structure 111 comprises the doped liner 114 with the second doping type (e.g., p-type doping) and a dielectric fill layer 112. The doped liner 114 lines a sidewall surface of a deep trench of the photodiode doping layer 128, and the dielectric fill layer 112 fills a remaining space of the deep trench. The doped liner 114 may comprise doped silicon or other doped semiconductor material with boron or other p-type dopants. The dielectric fill layer 112 may be made of silicon dioxide, silicon nitride, and/or other applicable dielectric material. The doped liner 114 and the dielectric fill layer 112 may extend laterally along the back-side 124 of the image sensing die 134. In some embodiments, a bowing tip at the top corner of the BDTI structure 111 has a bowing angle in a range of about 8° to 15° from an upper sidewall of the BDTI structure 111 to a vertical line perpendicular to a lateral plane of the photodiode doping layer 128. In some embodiments, the bowing tip is smaller than about 8°. As disclosed hereabove and hereafter, the bowing tip may be introduced by a manufacturing step of forming a deep trench for the BDTI structure 111 by an etching process. The etching process may involve anisotropic etching processes including dry etching and wet etching that may create an under-cut profile. The bowing top may be then removed or at least reduced by a cyclic cleaning process, leaving a smooth sidewall surface and a less bowing neck for the deep trench.

In some embodiments, a plurality of color filters 116 are arranged over the back-side 124 of the image sensing die 134. The plurality of color filters 116 are respectively configured to transmit specific wavelengths of incident radiation or incident light 120. For example, a first color filter (e.g., a red color filter) may transmit light having wavelengths within a first range, while a second color filter may transmit light having wavelengths within a second range different than the first range. In some embodiments, the plurality of color filters 116 may be arranged within a grid structure overlying a plurality of the photodiodes 104.

In some embodiments, a plurality of micro-lenses 118 is arranged over the plurality of color filters 116. Respective micro-lenses 118 are aligned laterally with the color filters 116 and overlie the pixel regions 103a, 103b. In some embodiments, the plurality of micro-lenses 118 have a substantially flat bottom surface abutting the plurality of color filters 116 and a curved upper surface. The curved upper surface is configured to focus the incident radiation or incident light 120 (e.g., light towards the underlying pixel regions 103a, 103b). During operation of the image sensor, the incident radiation or incident light 120 is focused by the micro-lenses 118 to the underlying pixel regions 103a, 103b. When incident radiation or incident light of sufficient energy strikes the photodiodes 104, it generates an electron-hole pair that produces a photocurrent. Notably, though the micro-lenses 118 is shown as fixing onto the image sensor in FIG. 1, it is appreciated that the image sensor may not include micro-lens, and the micro-lens may be attached to the image sensor later in a separate manufacture activity.

Figure 2:
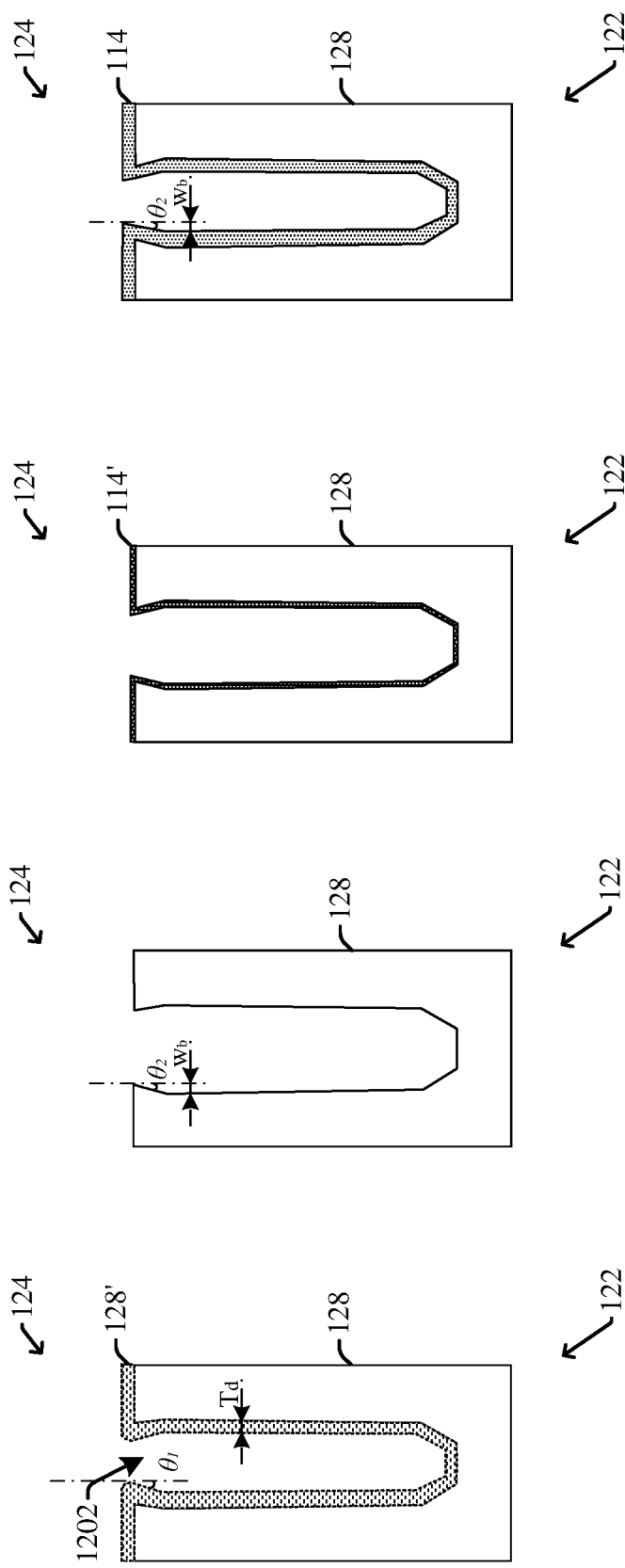
FIGS. 2A-2D illustrate a series of schematic diagrams of some embodiments of a method of forming a BDTI structure with a doped liner for an image sensor.

FIGS. 2A-2D illustrate a series of schematic diagrams of a method of preparing a deep trench 1202 and forming the doped liner 114 on a sidewall surface of the deep trench 1202 for an image sensor according to some embodiments. FIGS. 2A-2D show some intermediate parts of the image sensors disclosed in this application such as the image sensor 100 disclosed in FIG. 1 above during manufacturing processes. The deep trench 1202 is not a straight column because of attainable formation method. For example, as shown in FIG. 2A, the deep trench 1202 is formed from the back-side 124 of the photodiode doping layer 128 by an etching process. The etching process involves anisotropic etching processes including dry etching and wet etching such as using tetramethylammonium hydroxide (TMAH) as one of the etchant. The deep trench 1202 may have an under-cut profile and a bowing tip at the top corner of the deep trench 1202. The bowing tip may have a bowing angle $\theta_1$ in a range of about 15° to 30° from an upper sidewall of the deep trench 1202 to a vertical line perpendicular to plane of the photodiode doping layer 128. Also, an upper portion of the photodiode doping layer 128 exposing to the deep trench 1202 is damaged because of dislocation and native oxide formation and converts to a defective layer 128' with a thickness $T_d$ as a damage result of the etching process.

FIG. 2B shows the deep trench 1202 after a cyclic cleaning process. In some embodiments, the cyclic cleaning process is used to remove the defective layer 128' and smoothen sidewall surfaces of the deep trench 1202. The cyclic cleaning process may comprise using solutions of at least two different etchants such as hydrofluoric acid (HF) and ammonia and hydrogen peroxide mixtures (APM) alternatively for multiple cycles. This process is different from a general cleaning process such as a wet cleaning using hydrofluoric acid solution, a SiCoNi pre-cleaning, and/or other plasma enhanced pre-cleaning processes since the cyclic cleaning process intends to remove a substantial portion of the upper portion of the photodiode doping layer 128 to completely remove the defective layer 128' and achieve a smooth surface for subsequent deposition process. In some embodiments, the cyclic cleaning process removes the defective layer 128' with the thickness $T_d$ in a range of about 1-20 nm, or at least about 20 nm. As a result, sidewall surfaces of the deep trench 1202 are smoothen, and the bowing tip is reduced. A bowing width $W_b$ is defined as a lateral distance from the bowing tip to a body of the deep trench 1202 as shown in FIG. 2B. The bowing width $W_b$ may be linearly reduced as the cycles of the cleaning process increase. The resulted bowing tip may have a bowing angle $\theta_2$ reduced to be smaller than 15° from an upper sidewall of the deep trench 1202 to a vertical line perpendicular to plane of the photodiode doping layer 128. For example, the upper portion of the photodiode doping layer 128 may be removed for around 21 nanometers (nm) while each cycled removes around 6 angstroms (Å). The bowing width $W_b$ may be reduced to around 10 nm with 36 cycles of such cleaning. As a result, a sidewall profile of the BDTI structure is formed with less bowing neck, and performance of the image sensor can be improved because trench filling quality would be improved with a straighter sidewall of the deep trench 1202.

Then, as shown in FIG. 2C, a doped liner precursor 114' is formed on the smoothen sidewall surfaces of the deep trench 1202 through an epitaxial deposition process before filling remaining spaces of the deep trench 1202. The doped liner precursor 114' is formed by a lower temperature epitaxial deposition process with a delta doping of p-type dopants. In some embodiments, the doped liner precursor 114' may have a thickness of around 1.3 nm with a boron concentration around $1 \times 10^{19}$ cm$^{-3}$. In some embodiments, a dopant concentration of the doped liner precursor 114' may be in a range between approximately $5 \times 10^{19}$ atoms/cm$^3$ to approximately $2 \times 10^{20}$ atoms/cm$^3$. A thickness of the doped liner precursor 114' may be in a range between approximately 0.5 nm and approximately 3 nm. The doped liner precursor 114' may have a thickness not exceeding 10 nm. A thicker doped liner, a higher forming temperature, or a smaller concentration of dopants adversely affects the number of white pixels and/or the dark current of the image sensor. For example, a doped liner precursor with a thickness of around 10 nm and the same dopant concentration as the doped liner precursor 114' results more than 5 times of the number of white pixels and/or the dark current of the image sensor. A doped liner with a dopant concentration smaller than $8 \times 10^{19}$ cm$^{-3}$ greatly increases the number of white pixels and may even result failure of the image sensor.

As shown in FIG. 2D, a dopant activation process follows the formation of the doped liner precursor 114' to facilitate dopants diffusion from the doped liner precursor 114' to an adjoining portion of the and to form a doped liner 114. In some embodiments, the dopant activation process is a laser annealing process such as a dynamic surface anneal process and may include multiple rounds to achieve uniform dopant distribution. As an example, the dopants can be boron. A surface concentration of boron can be greater than $10^{20}$ cm$^3$, and a diffusion depth can be around 20 nm, at which depth from top the boron concentration is reduced to around $10^{15}$ cm$^{-3}$. In some embodiments, the bowing width $W_b$ and the bowing angle $\theta_2$ of the deep trench 1202 may substantially maintained after the formation of the doped liner 114 as described in FIG. 2C and FIG. 2D.

Figure 3:
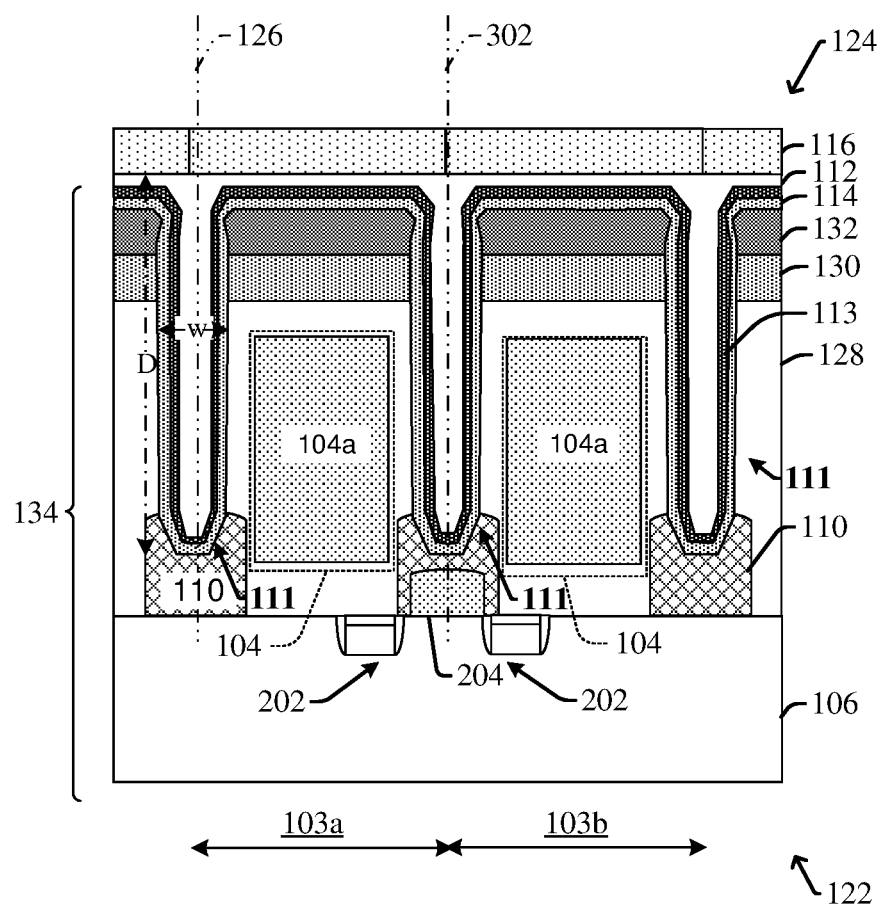
FIG. 3 illustrates a cross-sectional view of some other embodiments of an image sensor comprising a photodiode isolated by a shallow isolation well and a BDTI structure with a doped liner.

FIG. 3 illustrates a cross-sectional view of an image sensor 300 comprising a photodiode 104 isolated by a doped shallow isolation well 110 and a BDTI structure 111 with a doped liner 114 according to some other embodiments. Features of the image sensor 100 shown in FIG. 1 and other figures can be incorporated in the image sensor 300 when applicable. In some embodiments, the BDTI structure 111 may have a depth D in a range of between approximately 1.5 μm and approximately 5 μm. A lateral dimension W of the BDTI structure 111 may have a range between approximately 0.1 μm and approximately 0.3 μm. The lateral dimension of the BDTI structure 111 should be sufficient to perform the formation of the doped liner 114 and other layers inside the BDTI structure (for example, as described associated with FIGS. 13-16 below). A surface roughness of the doped liner 114 may be smaller than 3 Å. The conformity of the doped liner 114 from top to bottom is greater than 90%. In some embodiments, the more conformal thickness, the smoother surface, and the more uniform dopant concentration of the doped liner 114 is achieved by using the cyclic cleaning process, the epitaxial deposition process, and the dopant activation process described above associated with FIGS. 2B-2D. More details of the formation method of the doped liner 114 are also discussed associated with FIGS. 13-15.

In addition, in some embodiments, a doped shallow isolation well 110 is disposed between and isolate adjacent pixel regions 103a, 103b, extending from the front-side 122 of the image sensing die 134 to a position within the photodiode doping layer 128. The doped shallow isolation well 110 may have the second doping type (e.g., p-type doping). In some embodiments, a bottom portion of the BDTI structure 111 may be disposed within a recessed top surface of the doped shallow isolation well 110. In this case, the doped shallow isolation well 110 may reach less than a half or even less than ¼ depth of the BDTI structure 111. The doped shallow isolation well 110 may be vertically aligned with the BDTI structure 111 (e.g. sharing a common center line 126). The BDTI structure 111 and the doped shallow isolation well 110 collectively function as isolations for the pixel regions 103a, 103b, such that crosstalk and blooming among the pixel regions 103a, 103b can be reduced. The BDTI structure 111 and the doped shallow isolation well 110 also collectively facilitate depletion of the photodiode 104 during the operation since the BDTI structure 111 and the doped shallow isolation well 110 provide additional p-type dopants to the photodiode 104, such that full well capacity is improved.

In some embodiments, the BDTI structure 111 further comprises a high-k dielectric liner 113 disposed between the doped liner 114 and the dielectric fill layer 112 and separating the doped liner 114 from dielectric fill layer 112. The high-k dielectric liner 113 may also be a conformal layer. The high-k dielectric liner 113 may comprise aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HMO), for example. Other applicable high-k dielectric materials are also within the scope of the disclosure. In some embodiments, the high-k dielectric liner 113 may have a thickness range between approximately 30 nm and approximately 100 nm and may be made of composite of multiple high-k dielectric materials. The doped liner 114, the high-k dielectric liner 113, and the dielectric fill layer 112 may laterally extend along the back-side 124 of the image sensing die 134.

In some embodiments, a floating diffusion well 204 is disposed between the adjacent pixel regions 103a, 103b from the front-side 122 of the image sensing die 134 to a position within the photodiode doping layer 128. In some embodiments, the BDTI structure 111 extends to a location overlying the floating diffusion well 204. The BDTI structure 111 and the floating diffusion well 204 may be vertically aligned (e.g. sharing a common center line 302). A transfer gate 202 is arranged over the photodiode doping layer 128 at a position laterally between the photodiode 104 and the floating diffusion well 204. During the operation, the transfer gate 202 controls charge transfer from the photodiode 104 to the floating diffusion well 204. If the charge level is sufficiently high within the floating diffusion well 204, a source follower transistor (not shown) is activated and charges are selectively output according to operation of a row select transistor (not shown) used for addressing. A reset transistor (not shown) can be used to reset the photodiode 104 between exposure periods.

Figure 4:
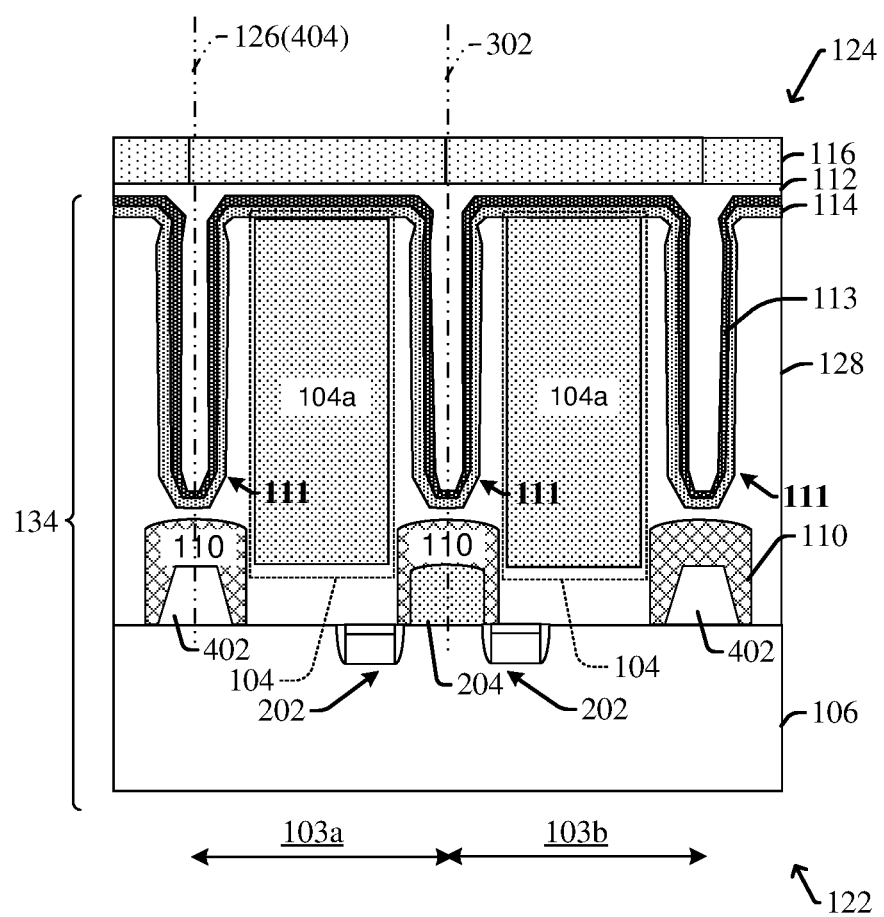
FIG. 4 illustrates a cross-sectional view of some other embodiments of an image sensor comprising a photodiode surrounded by a BDTI structure with a doped liner, a shallow isolation well, and a shallow trench isolation structure.

FIG. 4 illustrates a cross-sectional view of an image sensor 400 comprising a photodiode 104 surrounded by a BDTI structure 111 with a doped liner 114 according to some other embodiments. Features of the image sensors 100 and 300 shown in FIG. 1 and FIG. 3 and the image sensor shown in other figures can be incorporated in the image sensor 400 when applicable. In addition, in some embodiments alternative to FIG. 3, the doped shallow isolation well 110 may be separated from the BDTI structure 111 by the photodiode doping layer 128. Also, a shallow trench isolation (STI) structure 402 may be disposed between the adjacent pixel regions 103a, 103b from the front-side 122 of the image sensing die 134 to a position within the photodiode doping layer 128. The STI structure 402 and the BDTI structure 111 may be vertically aligned (e.g. sharing a common center line 404, which may share a center line with the doped shallow isolation well 110). In some embodiments, the doped shallow isolation well 110 extends from the front-side 122 of the image sensing die 134 to a position within the photodiode doping layer 128 and surrounds the STI structure 402. The doped shallow isolation well 110 may separate the STI structure 402 from the photodiode doping layer 128 and/or the BDTI structure 111. In some further embodiments, the photodiode doping columns 104a may extend to reach on a lateral portion of the doped liner 114 of the BDTI structure 111 from the back-side 124 of the image sensing die 134. The BDTI structure 111, the doped shallow isolation well 110, and the STI structure 402 collectively function as isolations for the pixel regions 103a, 103b, such that crosstalk and blooming among the pixel regions 103a, 103b can be reduced. The doped liner 114 of the BDTI structure 111 and the doped shallow isolation well 110 also collectively facilitate depletion of the photodiode 104 during the operation, such that full well capacity is improved.

Figure 5:
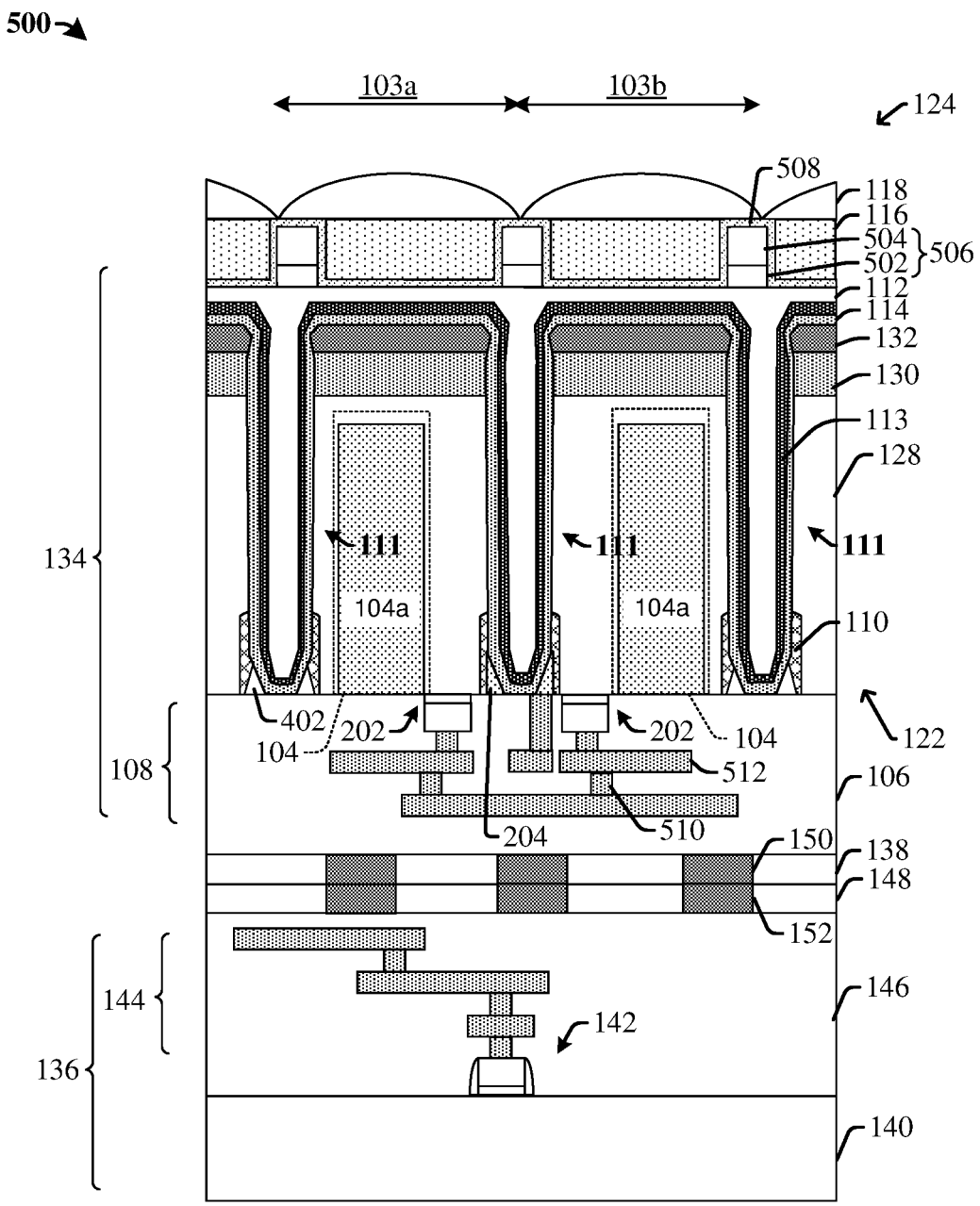
FIG. 5 illustrates a cross-sectional view of some embodiments of an integrated chip comprising an image sensing die and a logic die bonded together where the image sensing die has a photodiode surrounded by a BDTI structure with a doped liner.

FIG. 5 illustrates a cross-sectional view of an integrated chip 500 comprising an image sensing die 134 and a logic die 136 bonded together where the image sensing die 134 has a photodiode 104 surrounded by a BDTI structure 111 with a doped liner 114 according to some other embodiments. Features of the image sensors 100, 300, and 400 shown in FIG. 1, FIG. 3, and FIG. 4 and the image sensors shown in other figures can be incorporated in the image sensing die 134 when applicable. The image sensing die 134 may further comprise a composite grid 506 disposed between and overlying pixel regions 103a, 103b. The composite grid 506 may comprise a metal layer 502 and a dielectric layer 504 one stacked another at the back-side 124 of the image sensing die 134. A dielectric liner 508 lines sidewall and top of the composite grid 506. The metal layer 502 may be or be comprised of one or more layers of tungsten, copper, aluminum copper, or titanium nitride. The metal layer 502 may have a thickness range between approximately 100 nm and approximately 500 nm. The dielectric layer 504 may be or be comprised of one or more layers of silicon dioxide, silicon nitride, or the combination thereof. The dielectric layer 504 may have a thickness range between approximately 200 nm and approximately 800 nm. The dielectric liner 508 may may be or be comprised of an oxide, such as silicon dioxide. The dielectric liner 508 may have a thickness range between approximately 5 nm and approximately 50 nm. Other applicable metal materials are also within the scope of the disclosure. A metallization stack 108 may be arranged on the front-side 122 of the image sensing die 134. The metallization stack 108 comprises a plurality of metal interconnect layers arranged within one or more inter-level dielectric (ILD) layer 106. The ILD layer 106 may comprise one or more of a low-k dielectric layer (i.e., a dielectric with a dielectric constant less than about 3.9), an ultra low-k dielectric layer, or an oxide (e.g., silicon oxide). In some embodiments, the BDTI structure 111 may extend through the photodiode doping layer 128 and reach on the ILD layer 106 or a gate dielectric layer of transistor devices such as a gate dielectric of the transfer gate 202.

The logic die 136 may comprise logic devices 142 disposed over a logic substrate 140. The logic die 136 may further comprises a metallization stack 144 disposed within an ILD layer 146 overlying the logic devices 142. The image sensing die 134 and the logic die 136 may be bonded face to face, face to back, or back to back. As an example, FIG. 4 shows a face to face bonding structure where a pair of intermediate bonding dielectric layers 138, 148, and bonding pads 150, 152 are arranged between the image sensing die 134 and the logic die 136 and respectively bond the metallization stacks 108, 144 through a fusion or a eutectic bonding structure.

FIGS. 6-20 illustrate some embodiments of cross-sectional views 600-2000 showing a method of forming an image sensor having a photodiode surrounded by a BDTI structure with a doped liner. In some embodiments, the formation of the BDTI structure includes a cyclic cleaning process following etching of deep trenches such that a defective layer is removed and sidewall surfaces of the deep trenches are smoothed. Then the doped liner is formed on the smoothen sidewall surfaces of the deep trenches through an epitaxial deposition process before filling remaining spaces of the deep trenches. As a result, a sidewall profile of the BDTI structure is formed with less bowing neck, and performance of the image sensor can be improved. Though doping types are provided for varies doped regions as an example, it is appreciated that reversed doping types can be used for these doped regions to realize a reversed image sensor device structure.

Figure 6:
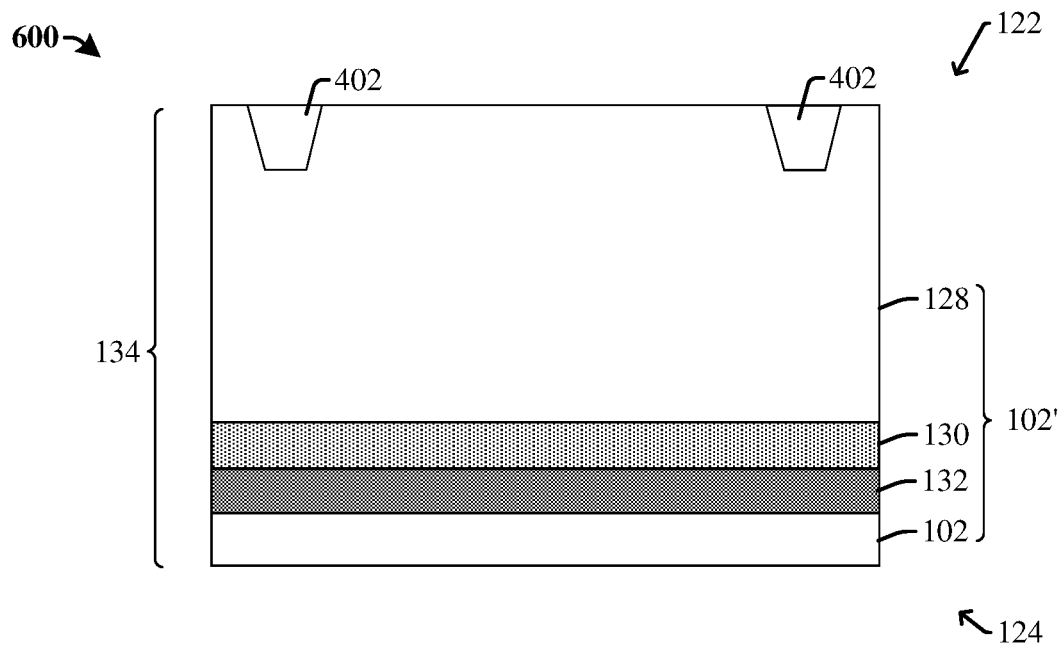
FIGS. 6-20 illustrate some embodiments of cross-sectional views showing a method of forming an image sensor having a photodiode surrounded by a BDTI structure having a conformal doped layer.

As shown in cross-sectional view 600 of FIG. 6, a substrate 102' is provided for an image sensing die 134. In various embodiments, the substrate 102' may comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers formed thereon and/or otherwise associated therewith. For example, a pixel array deep p-type well 132 may be formed on a handling substrate 102. The handling substrate 102 can be or be comprised of a highly doped p-type substrate layer. A pixel array deep n-type well 130 may be formed on the pixel array deep p-type well 132. The pixel array deep n-type well 130 and the pixel array deep p-type well 132 may be formed by implantation processes. In some embodiments, a photodiode doping layer 128 is formed as an upper portion of the substrate 102'. The photodiode doping layer 128 may be formed by a p-type epitaxial process. In some embodiments, a plurality of shallow trench isolation (STI) structures 402 is formed at a boundary and/or between adjacent pixel regions 103a, 103b from a front-side 122 of the image sensing die 134 to a position within the photodiode doping layer 128. The one or more STI structures 402 may be formed by selectively etching the front-side 122 of the image sensing die 134 to form shallow-trenches and subsequently forming an oxide within the shallow-trenches.

Figure 7:
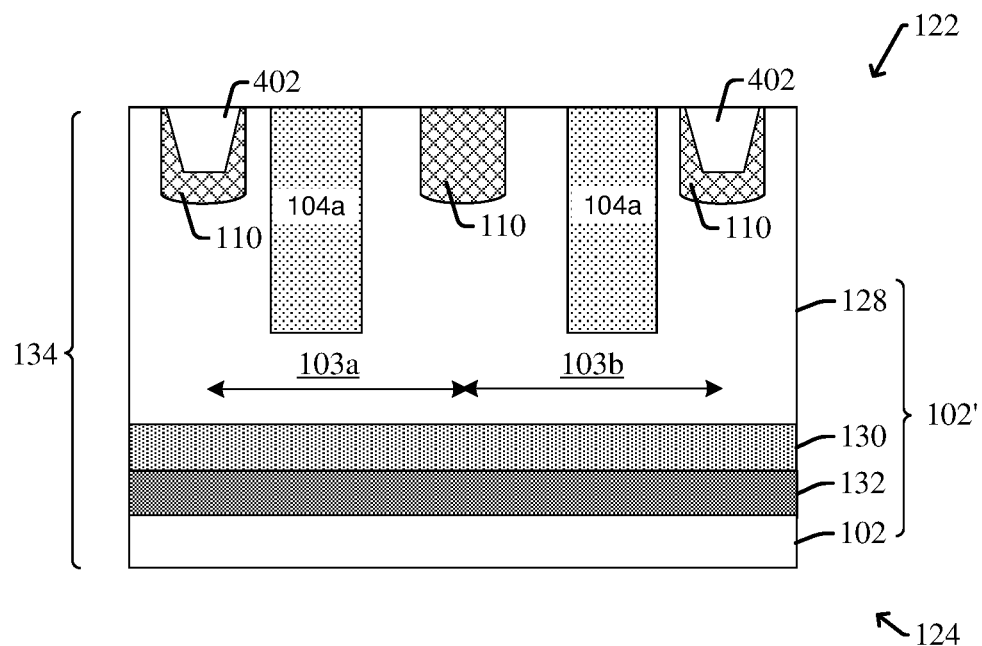

As shown in cross-sectional view 700 of FIG. 7, dopant species are implanted into the photodiode doping layer 128 to form doped region. A plurality of photodiode doping columns 104a may be formed by implanting n-type dopant species respectively within the pixel regions 103a, 103b. A plurality of doped shallow isolation wells 110 may be formed by implanting p-type dopant species into the photodiode doping layer 128 between adjacent pixel regions 103a, 103b. The plurality of doped shallow isolation wells 110 may be formed from the front-side 122 of the image sensing die 134 to a position deeper than the STI structures 402. The doped shallow isolation wells 110 may respectively be centrally aligned with the STI structures 402. In some embodiments, the photodiode doping layer 128 may be selectively implanted according to patterned masking layers (not shown) comprising photoresist.

Figure 8:
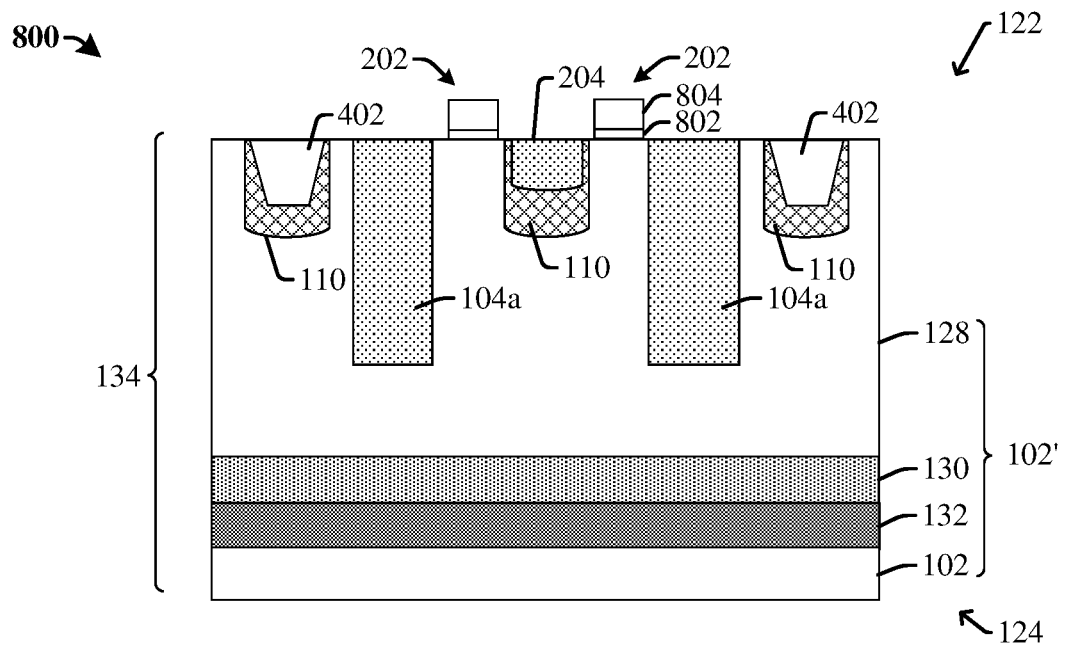

As shown in cross-sectional view 800 of FIG. 8, a transfer gate 202 is formed over a front-side 122 of the image sensing die 134. The transfer gate 202 may be formed by depositing a gate dielectric layer and a gate electrode layer over the substrate 102'. The gate dielectric layer and the gate electrode layer are subsequently patterned to form a gate dielectric 802 and a gate electrode 804. In some embodiments, an implantation process is performed within the front-side 122 of the image sensing die 134 to form a floating diffusion well 204 along one side of the transfer gate 202 or opposing sides of a pair of the transfer gates 202.

Figure 9:
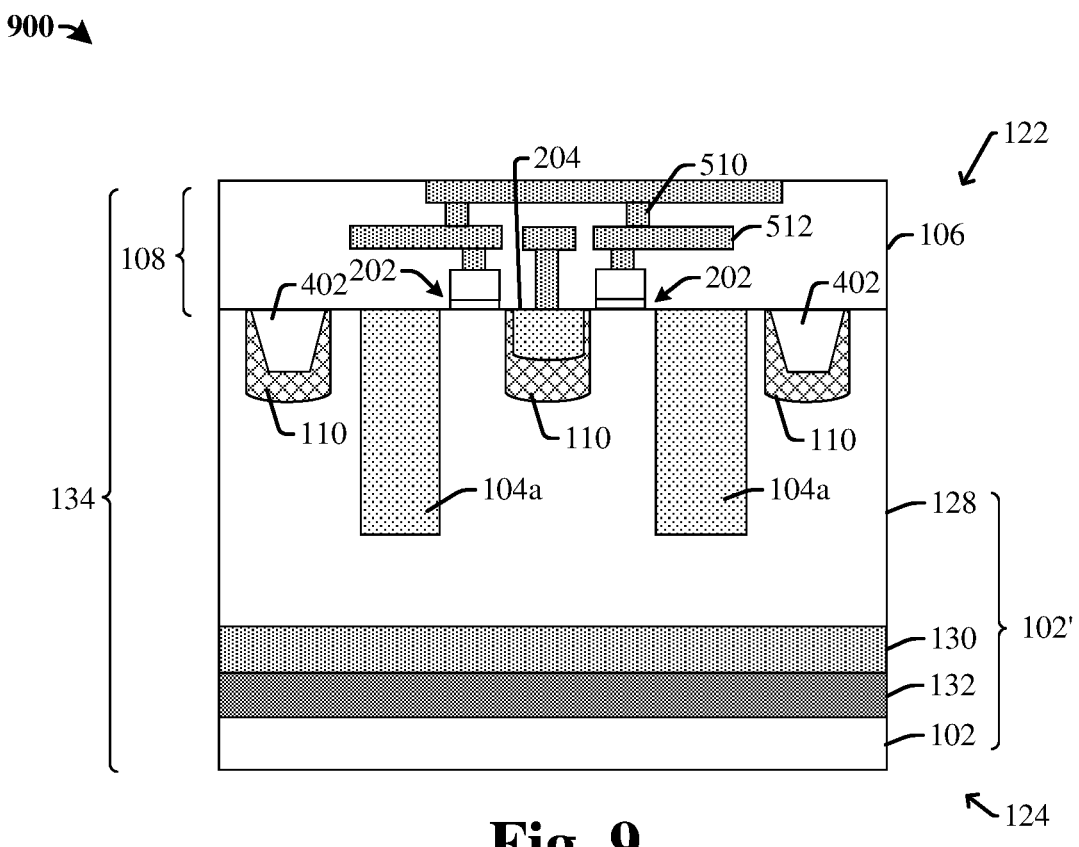

As shown in cross-sectional view 900 of FIG. 9, a metallization stack 108 may be formed on the front-side 122 of the image sensing die 134. In some embodiments, the metallization stack 108 may be formed by forming an ILD layer 106, which comprises one or more layers of ILD material, on the front-side 122 of the image sensing die 134. The ILD layer 106 is subsequently etched to form via holes and/or metal trenches. The via holes and/or metal trenches are then filled with a conductive material to form the plurality of metal interconnect vias 510 and metal lines 512. In some embodiments, the ILD layer 106 may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example.

Figure 10:
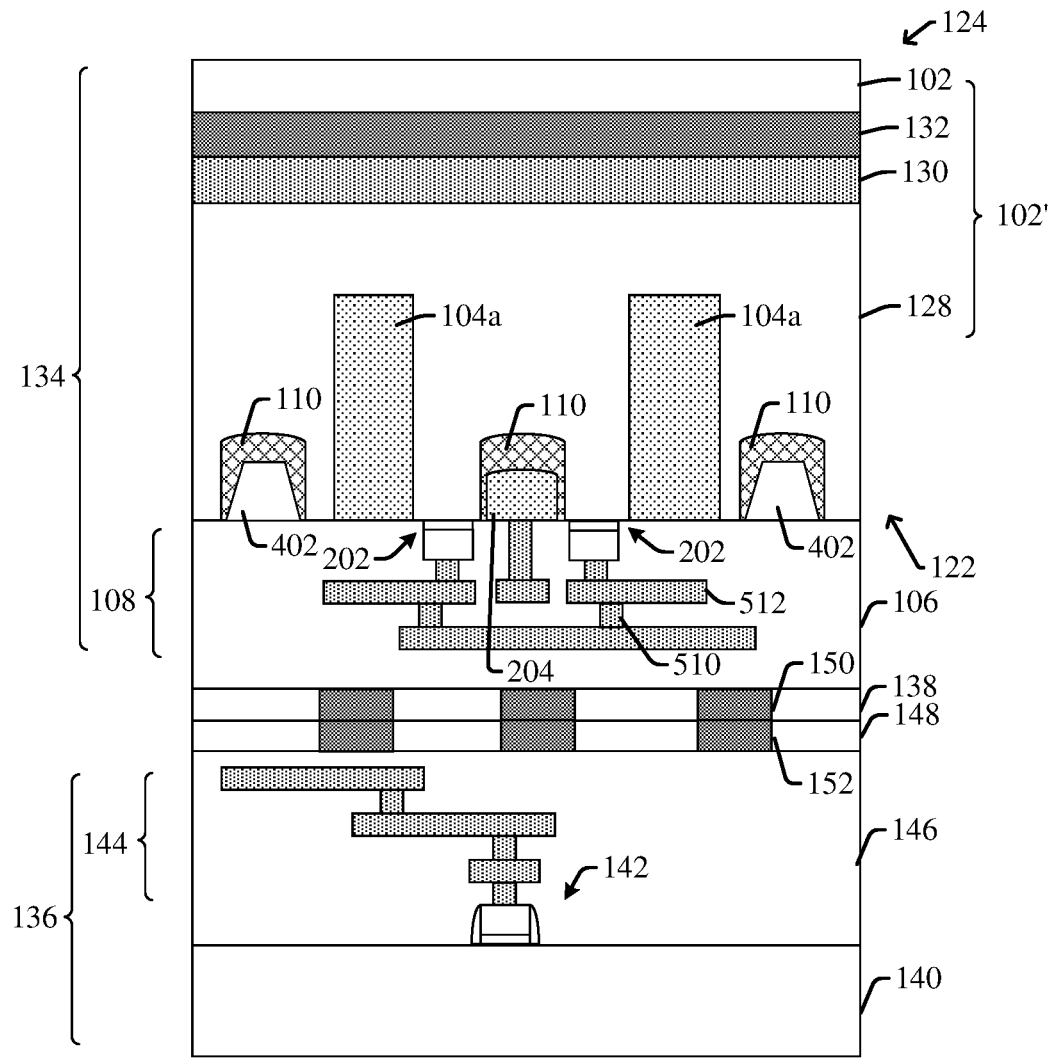

As shown in cross-sectional view 1000 of FIG. 10, the image sensing die 134 can be then bonded to one or more other dies. For example, the image sensing die 134 can be bonded to a logic die 136 prepared to have logic devices 142. The image sensing die 134 and the logic die 136 may be bonded face to face, face to back, or back to back. For example, the bonding process may use a pair of intermediate bonding dielectric layers 138, 148, and bonding pads 150, 152 to bond the metallization stacks 108, 144 of the image sensing die 134 and the logic die 136. The bonding process may comprise a fusion or a eutectic bonding process. The bonding process may also comprise a hybrid bonding process including metal to metal bonding of the bonding pads 150, 152, and dielectric to dielectric bonding of the intermediate bonding dielectric layers 138, 148. An annealing process may follow the hybrid bonding process, and may be performed at a temperature range between about 250° C. to about 450° for a time in a range of about 0.5 hour to about 4 hours, for example.

Figure 11:
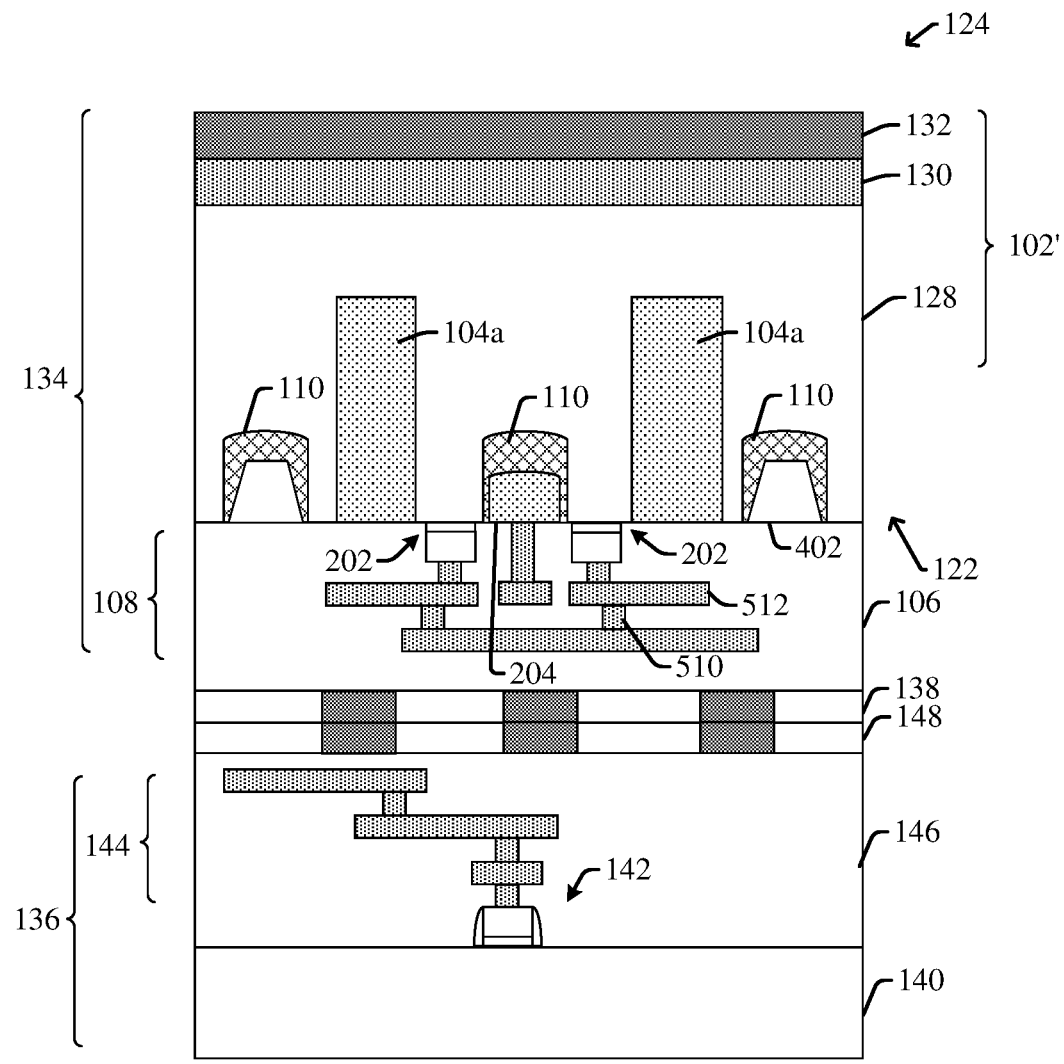

As shown in cross-sectional view 1100 of FIG. 11, the image sensing die 134 is thinned on a back-side 124 that is opposite to the front-side 122. The thinning process may partially or completely removes the handling substrate 102 (See FIG. 10) and allow for radiation to pass through the back-side 124 of the image sensing die 134 to the photodiode 104. In some embodiments, the image sensing die 134 is thinned to expose the photodiode doping columns 104a, such that radiation can reach on the photodiode more easily. Then a later formed BDTI structure or a semiconductor layer there in (see BDTI structure 111 or doped liner 114 in FIG. 16 for example) may be formed to reach on a surface of the photodiode doping columns 104a. The substrate 102' may be thinned by etching the back-side 124 of the image sensing die 134. Alternatively, the substrate 102' may be thinned by mechanical grinding the back-side 124 of the image sensing die 134. As an example, the substrate 102' can be firstly grinded to a thickness range between approximately 17 μm and approximately 45 μm. Then, an aggressive wet etch can be applied to further thin the substrate 102'. An example of the etchant may include hydrogen fluoride/nitric/acetic acid (HNA). A chemical mechanical process and a tetramethylammonium hydroxide (TMAH)) wet etching may then follow to further thin a thickness range between approximately 2.8 μm and approximately 7.2 μm so the radiation can pass through the back-side 124 of the image sensing die 134 to reach the photodiode 104.

Figure 12:
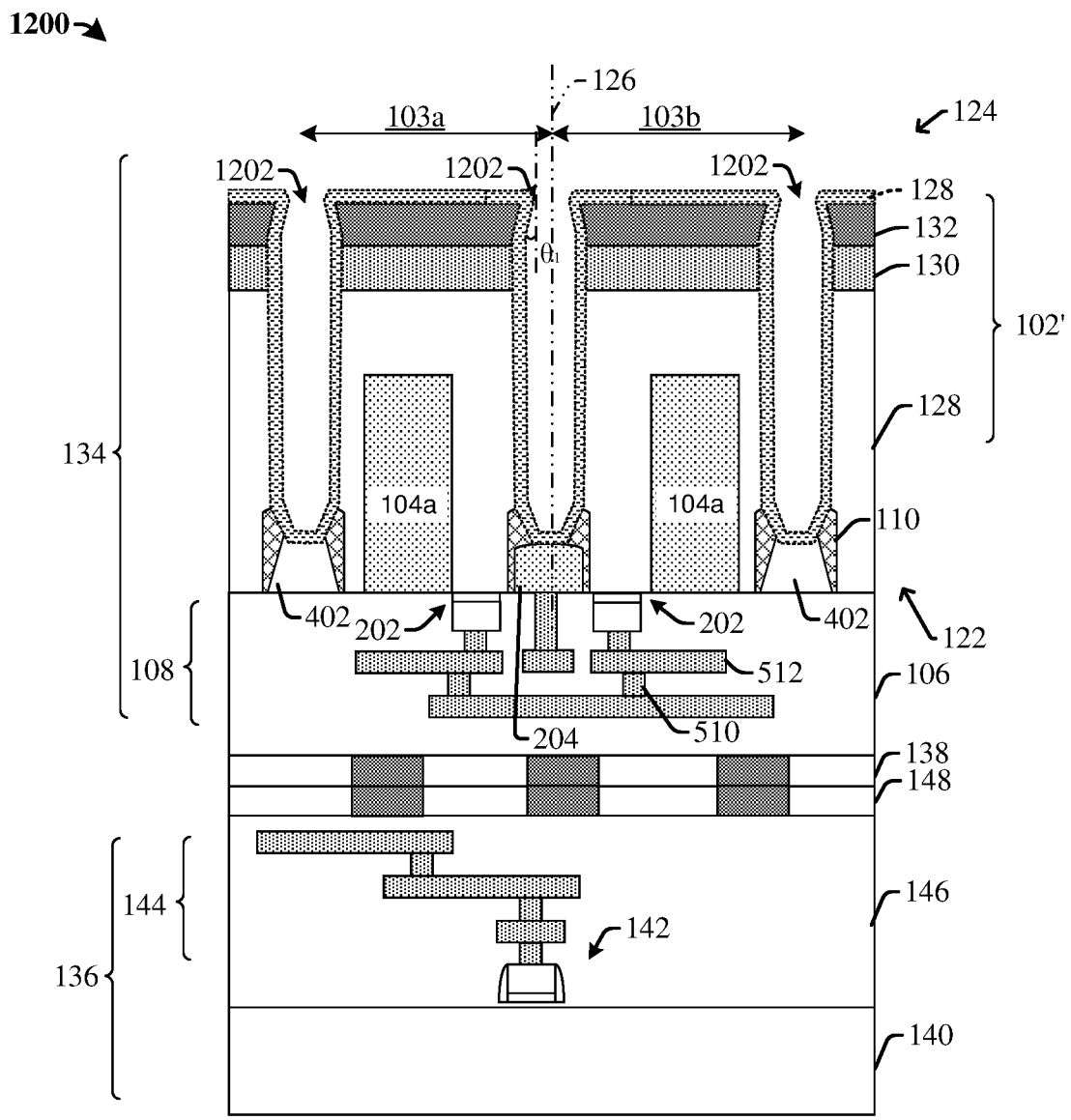

As shown in cross-sectional view 1200 of FIG. 12, the substrate 102' is selectively etched to form deep trenches 1202 within the back-side 124 of the image sensing die 134 laterally separating the photodiode 104. In some embodiments, the substrate 102' may be etched by forming a masking layer onto the back-side 124 of the image sensing die 134. The substrate 102' is then exposed to an etchant in regions not covered by the masking layer. The etchant etches the substrate 102' to form the deep trenches 1202 extending into the substrate 102'. In some alternative embodiments, the substrate 102' or the photodiode doping layer 128 is etched thoroughly in depth when forming the deep trenches 1202, and the deep trenches 1202 extend through the substrate 102' and may reach on the ILD layer 106, such that a complete isolation is achieved. In various embodiments, the masking layer may comprise photoresist or a nitride (e.g., SiN) patterned using a photolithography process. The masking layer may also comprise atomic layer deposition (ALD) or plasma enhanced CVD oxide layer with a thickness range between about 200 angstrom (Å) to about 1000 angstrom (Å). In various embodiments, the etchant may comprise a dry etchant have an etching chemistry comprising a fluorine species (e.g., $CF_4$, $CHF_3$, $C_4F_8$, etc.) or a wet etchant (e.g., hydroflouric acid (HF) or tetramethylammonium hydroxide (TMAH)). The deep trenches 1202 may have a depth range between approximately 1.5 μm and approximately 5 μm. A lateral dimension may have a range between approximately 0.1 μm and approximately 0.3 μm. The deep trench 1202 may have an under-cut profile and a bowing tip at the top of the deep trench 1202. Also, an upper portion of the photodiode doping layer 128 forms a defective layer 128' exposing to the deep trench 1202 as a damage result of the etching process and may include native oxide and other unwanted impurity layers.

Figure 13:
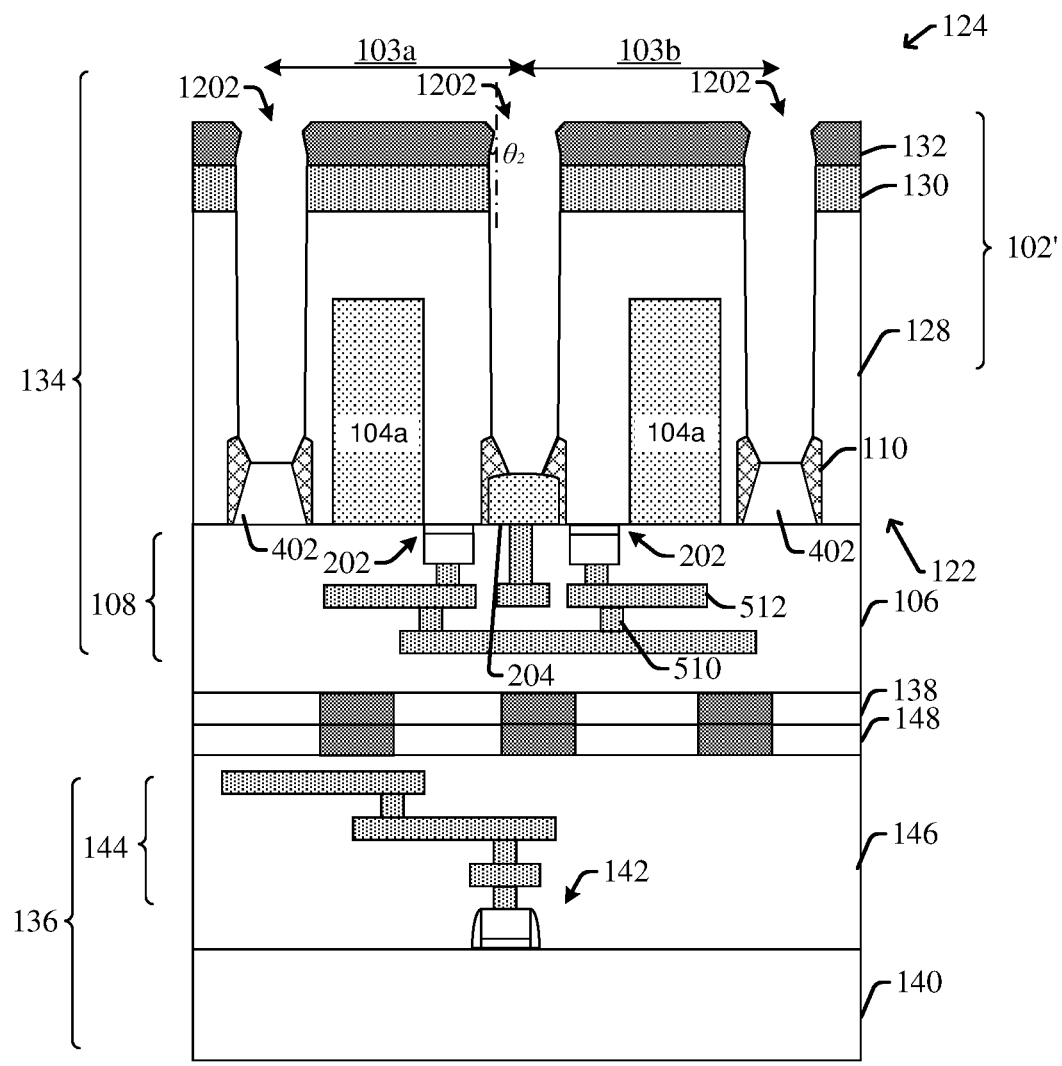

As shown in cross-sectional view 1300 of FIG. 13, a cyclic cleaning process is performed to the deep trenches 1202 to remove the defective layer 128' and smoothen sidewall surfaces of the deep trench 1202. The cyclic cleaning process may comprise using solutions of hydrofluoric acid (HF) and ammonia and hydrogen peroxide mixtures (APM) alternatively for multiple cycles. For example, the defective layer 128' may be removed for around 21 nanometers (nm) while each cycled removes around 6 angstrom (Å). As a result, the bowing tip is reduced beside smoothing sidewall surfaces of the deep trench 1202. The resulted bowing tip may have a bowing angle $\theta_2$ smaller than 15° from an upper sidewall of the deep trench 1202 to a vertical line perpendicular to plane of the photodiode doping layer 128. In some embodiments, the bowing angle $\theta_2$ is smaller than 8° such that a better filling result can be achieved. In some embodiments, some other cleaning processes may follow the cyclic cleaning process. An additional wet cleaning process using HF and a remote plasma SiCoNi cleaning may be performed to further improve characters of dark current and white pixels of the image sensor. A pre-cleaning process using HF solution may be used prior to the cyclic cleaning process to remove native oxide. As an example, the pre-cleaning process may use a HF solution with a 130 (water):1 (chemical) ratio for 90 seconds and a queue time less than two hours.

Figure 14:
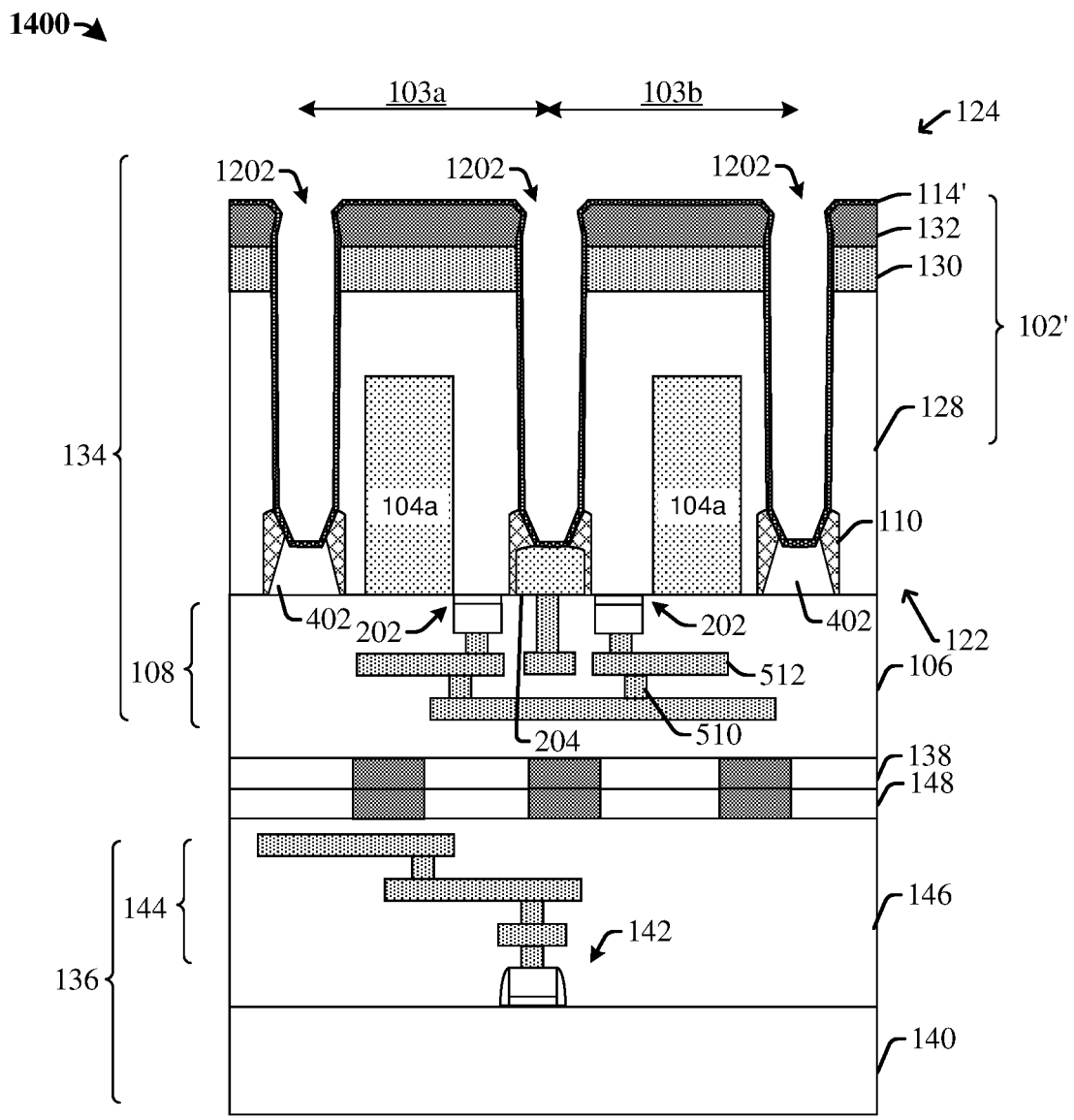

As shown in cross-sectional view 1400 of FIG. 14, a doped liner precursor 114' is formed on sidewall and bottom surfaces of the deep trenches 1202. In some embodiments, the doped liner precursor 114' may be formed by a low temperature epitaxial growth process, for example, an epitaxial growth process with a temperature lower than 500° C. Processing gases may comprise silane ($SiH_4$), dichlorosilane (DCS, or $H_2SiCl_2$), diboran ($B_2H_6$), hydrogen ($H_2$) or other applicable gases. The epitaxial growth process may be performed in a low pressure chemical vapor deposition epitaxial tool at a pressure in a range between approximately 4 torr and approximately 200 torr at a temperature range between approximately 400° C. to approximately 490° C. to form an epitaxial doped layer as the doped liner precursor 114' with a thickness in a range between approximately 0.5 nm and approximately 3 nm, such as around 2 nm. The doped liner precursor 114' may not exceed a thickness of 10 nm, and may further not exceed 3 nm to sufficiently limit defects and roughness. The forming temperature should not be higher than 490° C. since a higher forming temperature would cause a lower dopant concentration and an increased roughness. The doped liner precursor 114' is formed on the smoothen sidewall surfaces of the deep trench 1202 and would result a better conformity than conventional beamline implant technique, which suffers shadowing effect for three-dimensional structure and cannot achieve desired conformity. The doped liner precursor 114' is formed with a delta doping. A concentration of boron can be in a range of from about $5\times10^{19}$ $cm^{-3}$ to about $2\times10^{20}$ $cm^{-3}$, and may further not less than $1\times10^{19}$ $cm^{-3}$. A thicker doped liner or a smaller concentration of dopants adversely affects the number of white pixels and/or the dark current of the image sensor.

Figure 15:
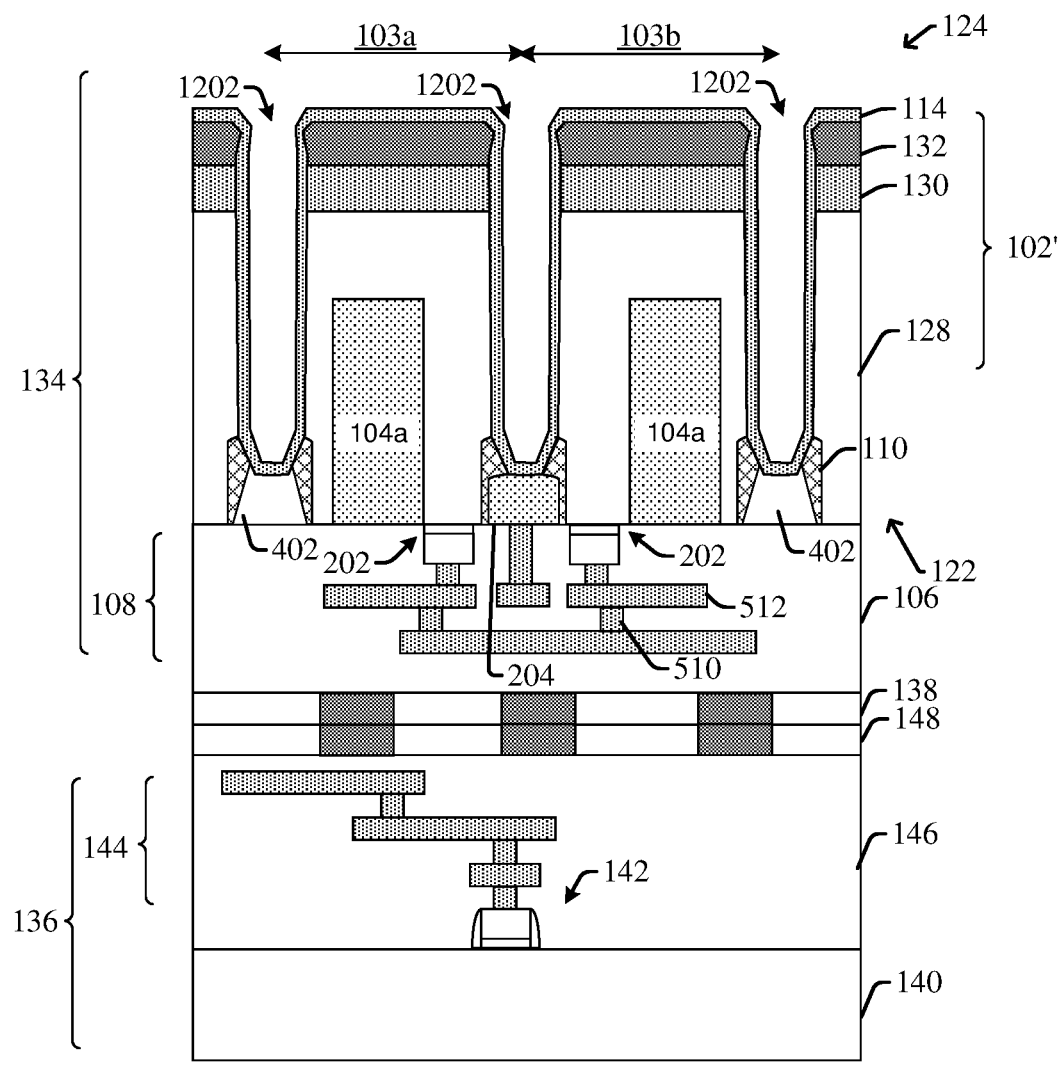

As shown in cross-sectional view 1500 of FIG. 15, a dopant activation process is then performed to facilitate diffusion and to form the doped liner 114. In some embodiments, the dopant activation process comprises or is a laser annealing process or a dynamic surface annealing process. As an example, the annealing may use a green laser, and the annealing temperature may be in a range between approximately 800° C. and approximately 1100° C. for a time in a range between approximately 10 nanoseconds and approximately 100 nanoseconds. The dopant activation process is beneficial to low thermal budget products, especially compared to other approaches such as a deposition process followed by a thermal drive-in process, which either can't provide enough junction depth or not acceptable for low thermal budget product because of the high temperature junction drive-in and anneal for damage recovery and dopant activation.

Figure 16:
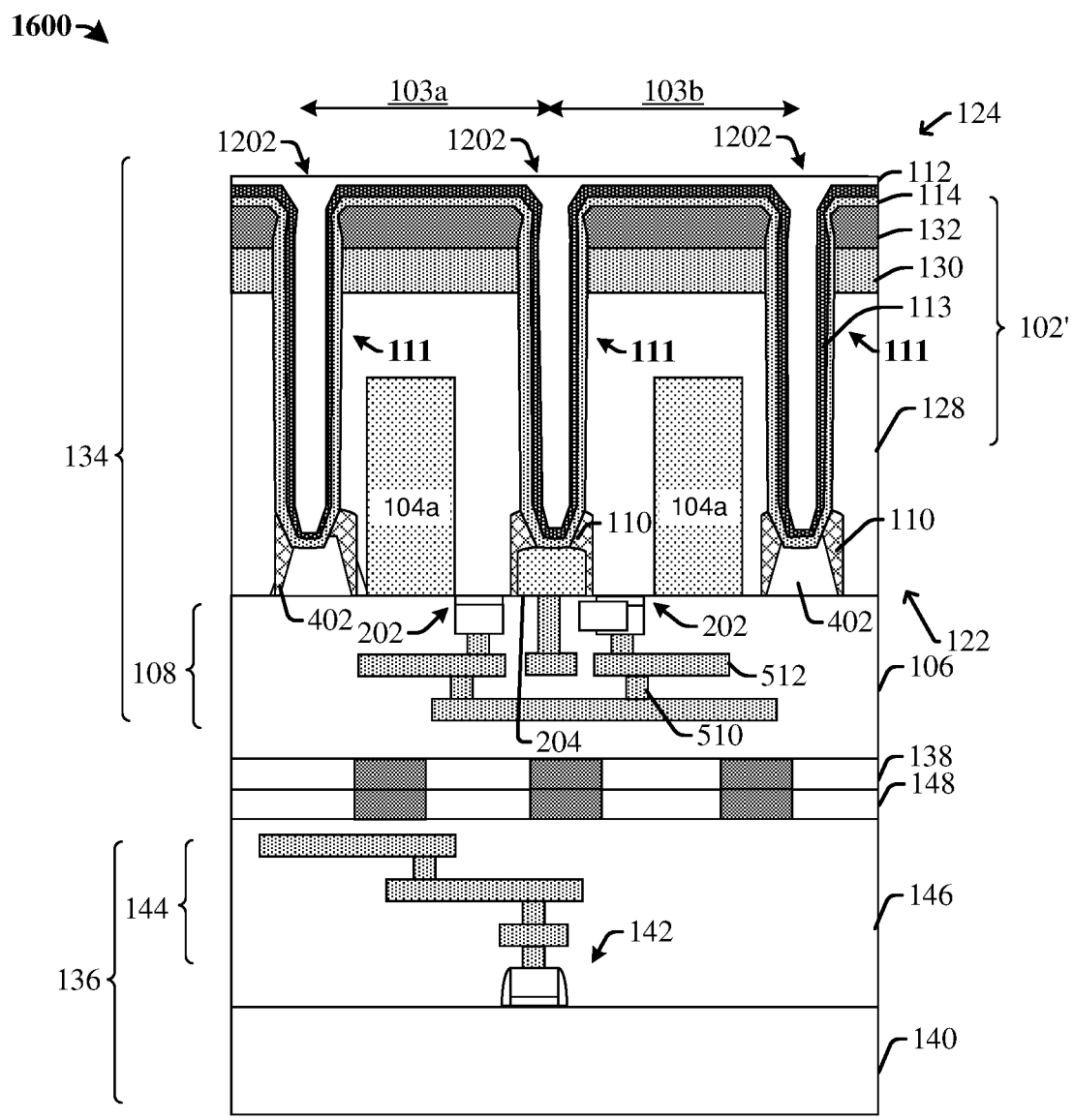

As shown in cross-sectional view 1600 of FIG. 16, the deep trenches 1202 are then filled with dielectric materials. In some embodiments, a high-k dielectric liner 113 is formed within the deep trenches 1202 along the doped liner 114. The high-k dielectric liner 113 may be formed by deposition techniques and may comprise aluminum oxide (AlO), hafnium oxide (HfO), tantalum oxide (TaO) or other dielectric materials having a dielectric constant greater than that of silicon oxide. The doped liner 114 and the high-k dielectric liner 113 line sidewalls and bottom surfaces of the deep trenches 1202. In some embodiments, the doped liner 114 and the high-k dielectric liner 113 may extend over the back-side 124 of the image sensing die 134 between the deep trenches 1202. A dielectric fill layer 112 is formed to fill a remainder of the deep trenches 1202. In some embodiments, a planarization process is performed after forming the dielectric fill layer 112 to form a planar surface that extends along an upper surface of the high-k dielectric liner 113 and the dielectric fill layer 112. The doped liner 114, the high-k dielectric liner 113, and the dielectric fill layer 112 may subject to a planarization process that removes lateral portions of the overlying the dielectric fill layer 112, the high-k dielectric liner 113, and the doped liner 114 directly overlying pixel regions 103a, 103b. In some embodiments, the high-k dielectric liner 113, and the dielectric fill layer 112 may be deposited using a physical vapor deposition technique or a chemical vapor deposition technique. As a result, the BDTI structure 111 is formed in the substrate 102', extending from the back-side 124 to a position within the photodiode doping layer 128. The BDTI structure 111 is formed between and isolate adjacent pixel regions 103a, 103b.

The cleaning process, the epitaxial growth process, and the activation process described above provide an improved conformal doping liner with a more conformal thickness, a more uniform doping concentration, and a smoother interface with the underlying photodiode doping layer 128. A surface roughness can also be reduced compared to the surface roughness of a doped liner formed without the cyclic cleaning process or the epitaxial growth process.

Figure 17:
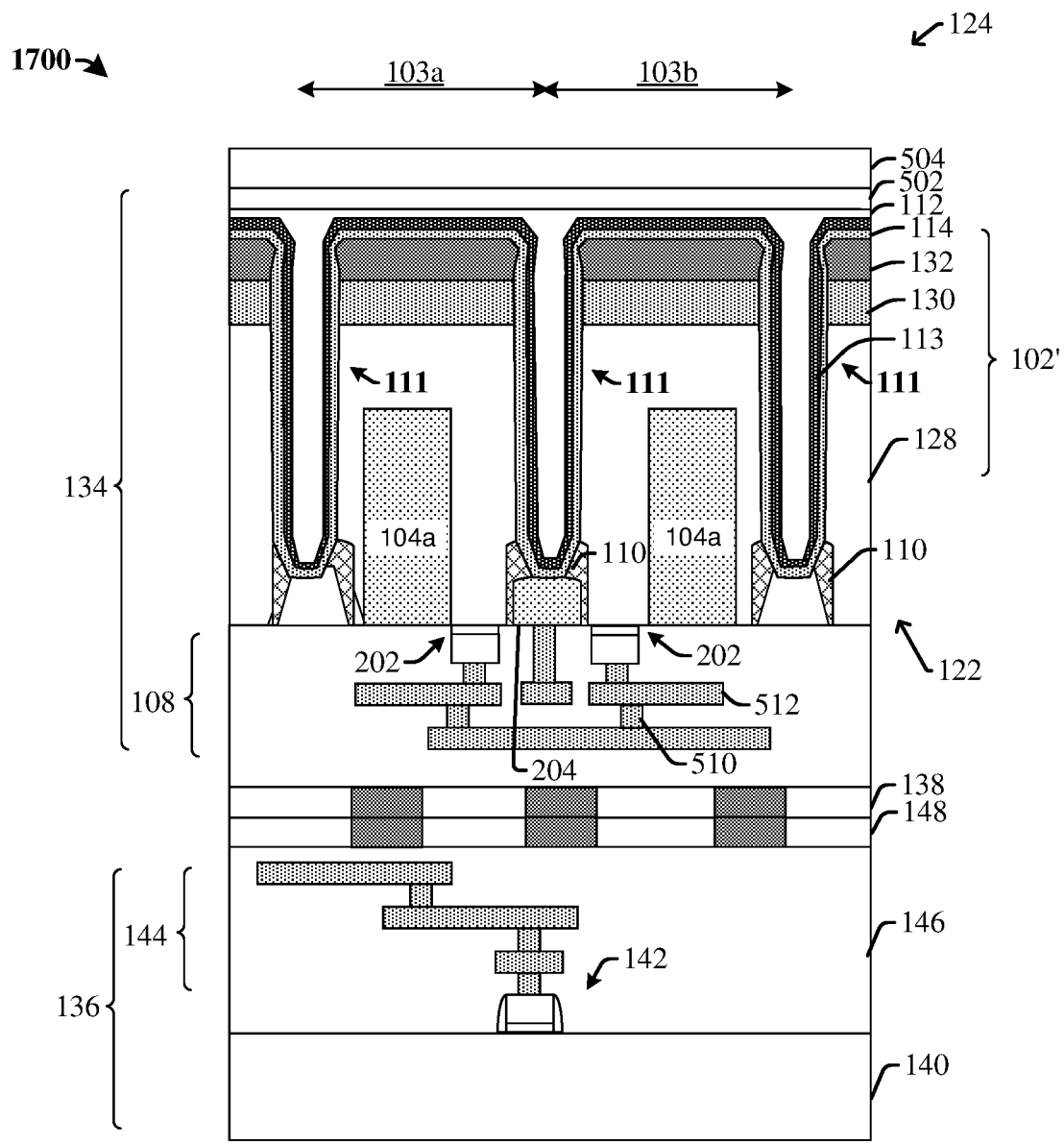
Figure 18:
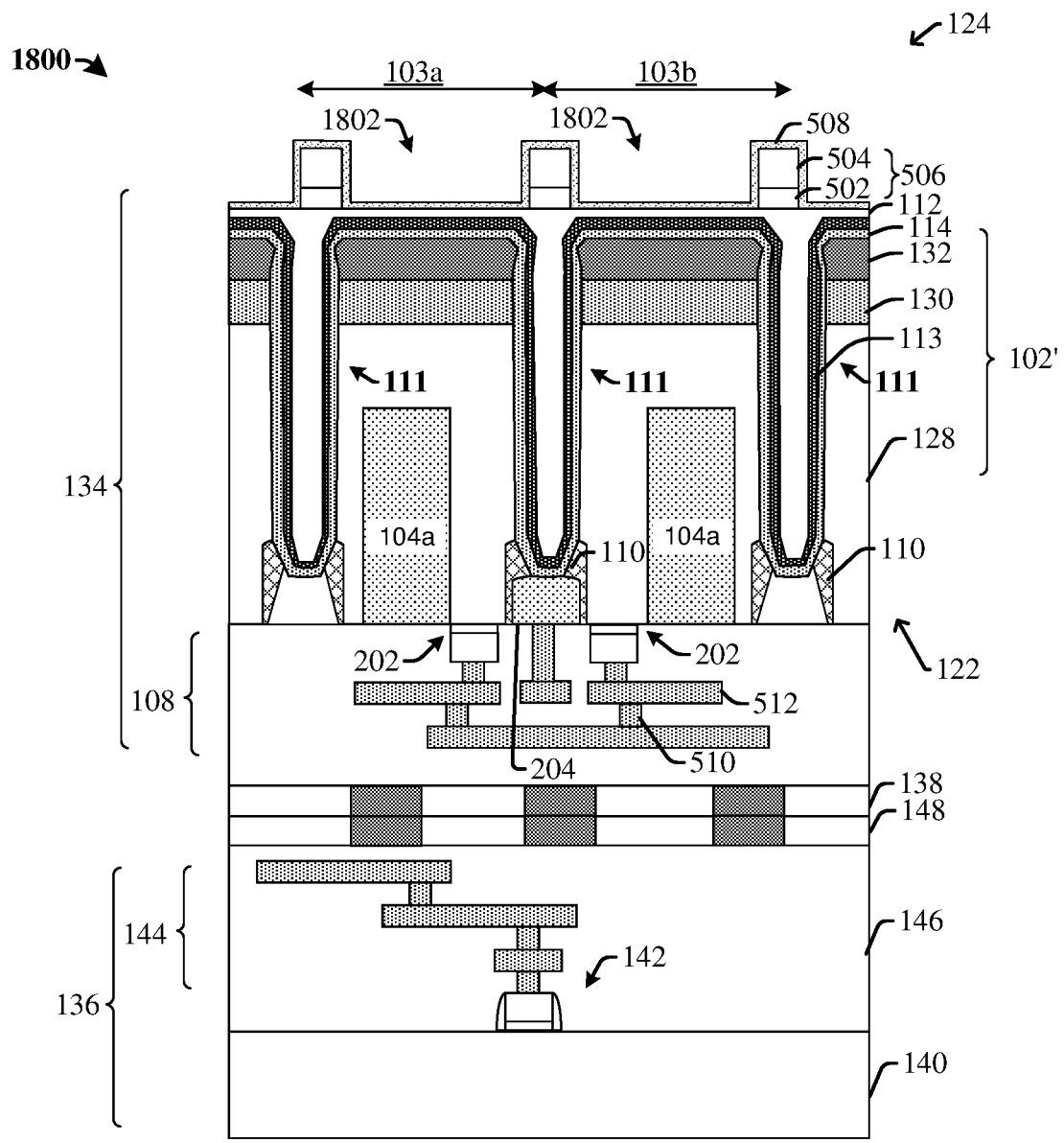
Figure 19:
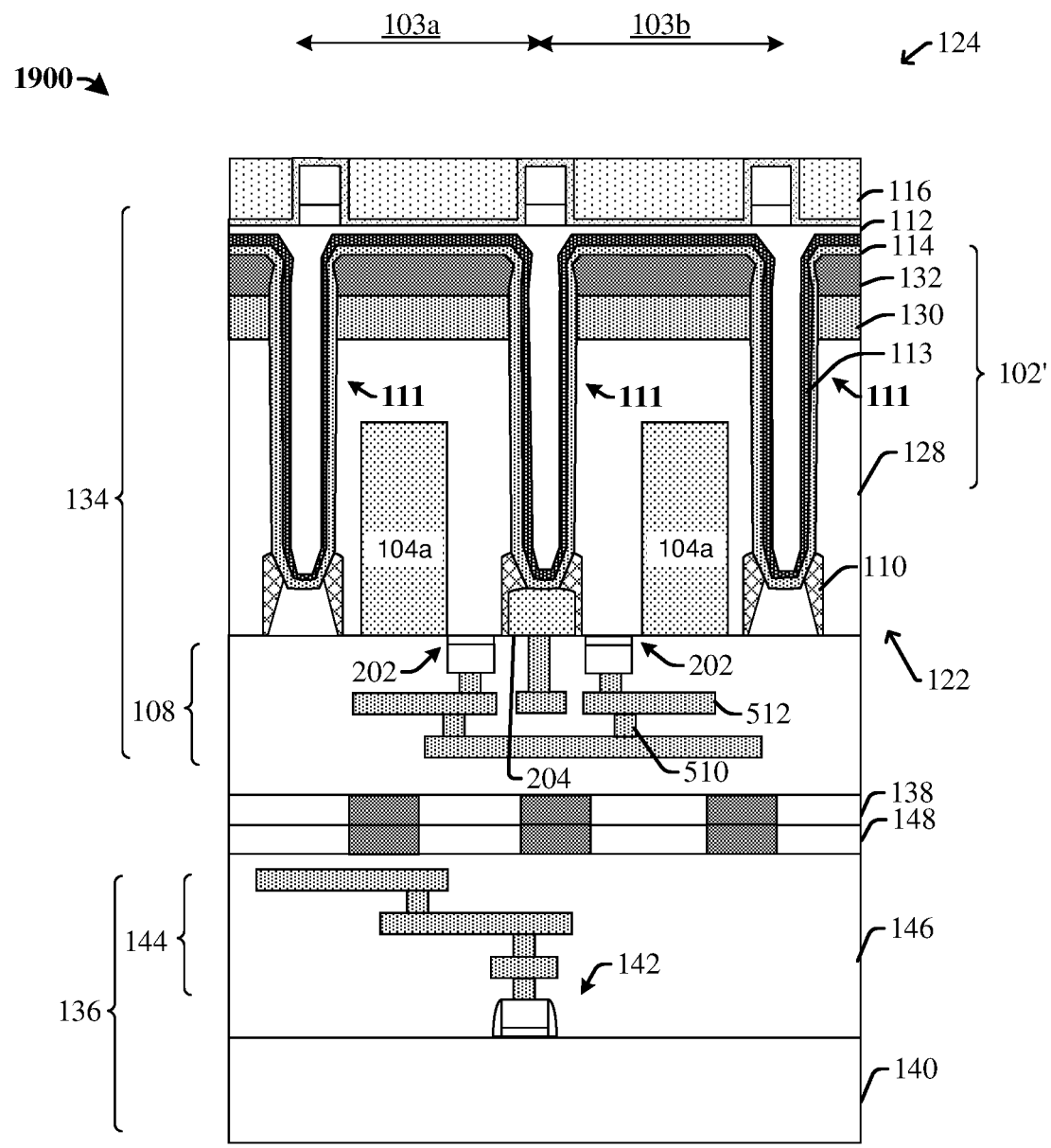

FIGS. 17-19 show some embodiments of a method of forming color filters 116 overlying the photodiode doping columns 104a. As shown in cross-sectional view 1700 of FIG. 17, a metal layer 502 and a dielectric layer 504 are stacked over the substrate 102' along the back side 124 of the image sensing die 134. The metal layer 502 may be or be comprised of one or more layers of tungsten, copper, aluminum copper, or titanium nitride. Other applicable metal materials are also within the scope of the disclosure. The dielectric layer 504 may be or be comprised of one or more layers of silicon dioxide, silicon nitride, or the combination thereof. The dielectric layer 504 may function as a hard mask layer. As shown in cross-sectional view 1800 of FIG. 18, an etch is performed to the metal layer 502 and the dielectric layer 504 to form the composite grid 506. The openings 1802 may be centrally aligned with the photodiode doping columns 104a so that the composite grid 506 is arranged around and between the photodiode doping columns 104a. Alternatively, the openings 1802 may be laterally shifted or offset in at least one direction from the photodiode doping columns 104a so that the composite grid 506 at least partially overlies the photodiode doping columns 104a. Then, a dielectric liner 508 is formed lining sidewall and top of the composite grid 506, and lining the openings 1802. The dielectric liner 508 may be formed using a conformal deposition technique, such as, for example, chemical vapor deposition (CVD) or physical vapor deposition (PVD). The dielectric liner 508 may be, for example, formed of an oxide, such as silicon dioxide. As shown in FIG. 19, color filters 116 corresponding to pixel sensors are formed in the openings 1802 of the corresponding pixel sensors. The color filter layer is formed of a material that allows light of the corresponding color to pass therethrough, while blocking light of other colors. Further, the color filters 116 may be formed with assigned colors. For example, the color filters 116 are alternatingly formed with assigned colors of red, green, and blue. The color filters 116 may be formed with upper surfaces aligned with that of the composite grid 506. The color filters 116 may be laterally shifted or offset in at least one direction from the photodiode doping columns 104a of the corresponding pixel sensors. Depending upon the extent of the shift or offset, the color filters 116 may partially fill the openings of the corresponding pixel sensors and may partially fill the openings of pixel sensors neighboring the corresponding pixel sensors. Alternatively, the color filters 116 may be symmetrical about vertical axes aligned with photodiode centers of the corresponding pixel sensors. The process for forming the color filters 116 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 20:
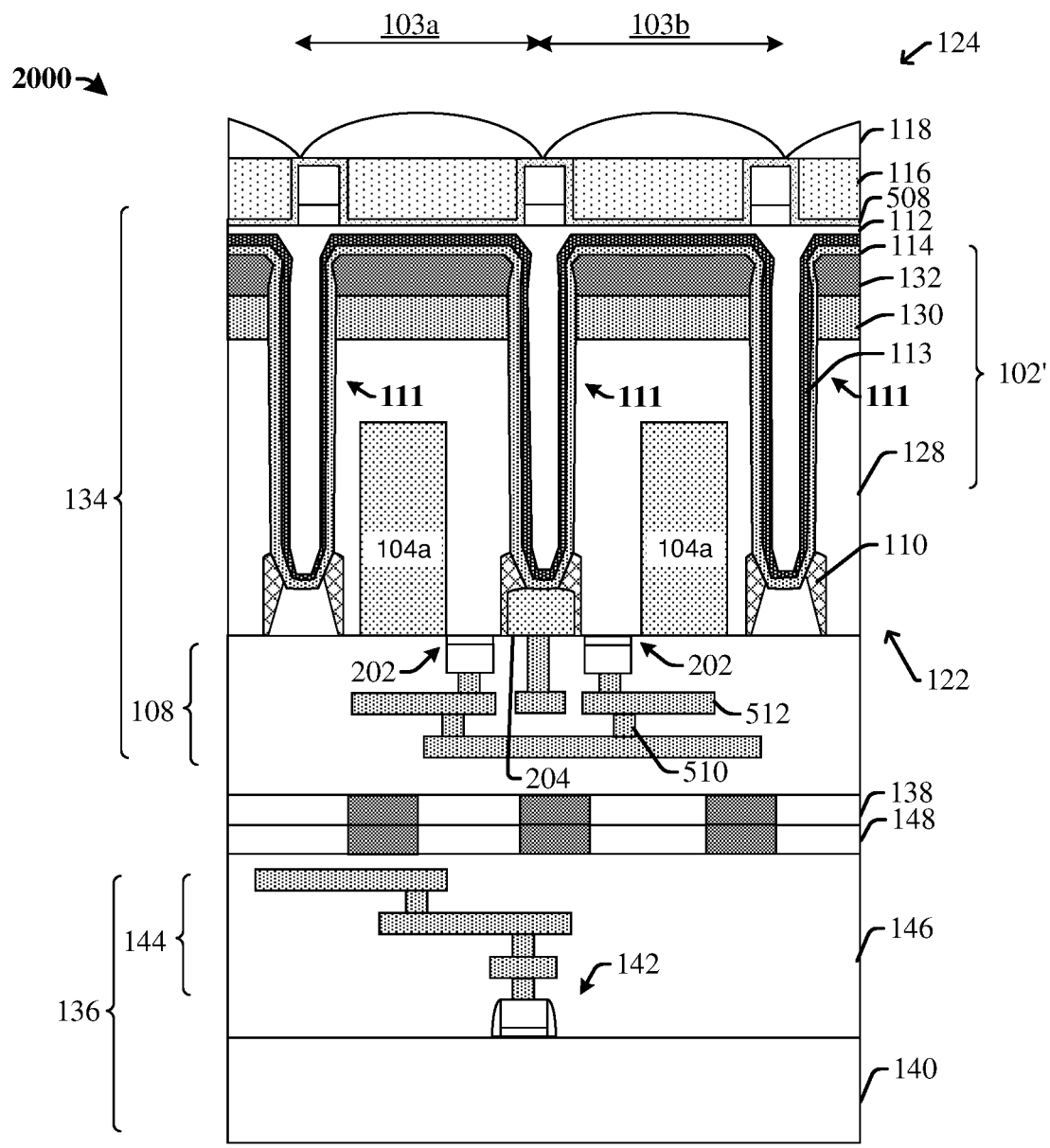

As illustrated by FIG. 20, micro-lenses 118 corresponding to the pixel sensors are formed over the color filters 116 of the corresponding pixel sensors. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 118 are then formed by selectively etching the micro-lens material according to the micro-lens template.

Figure 21:
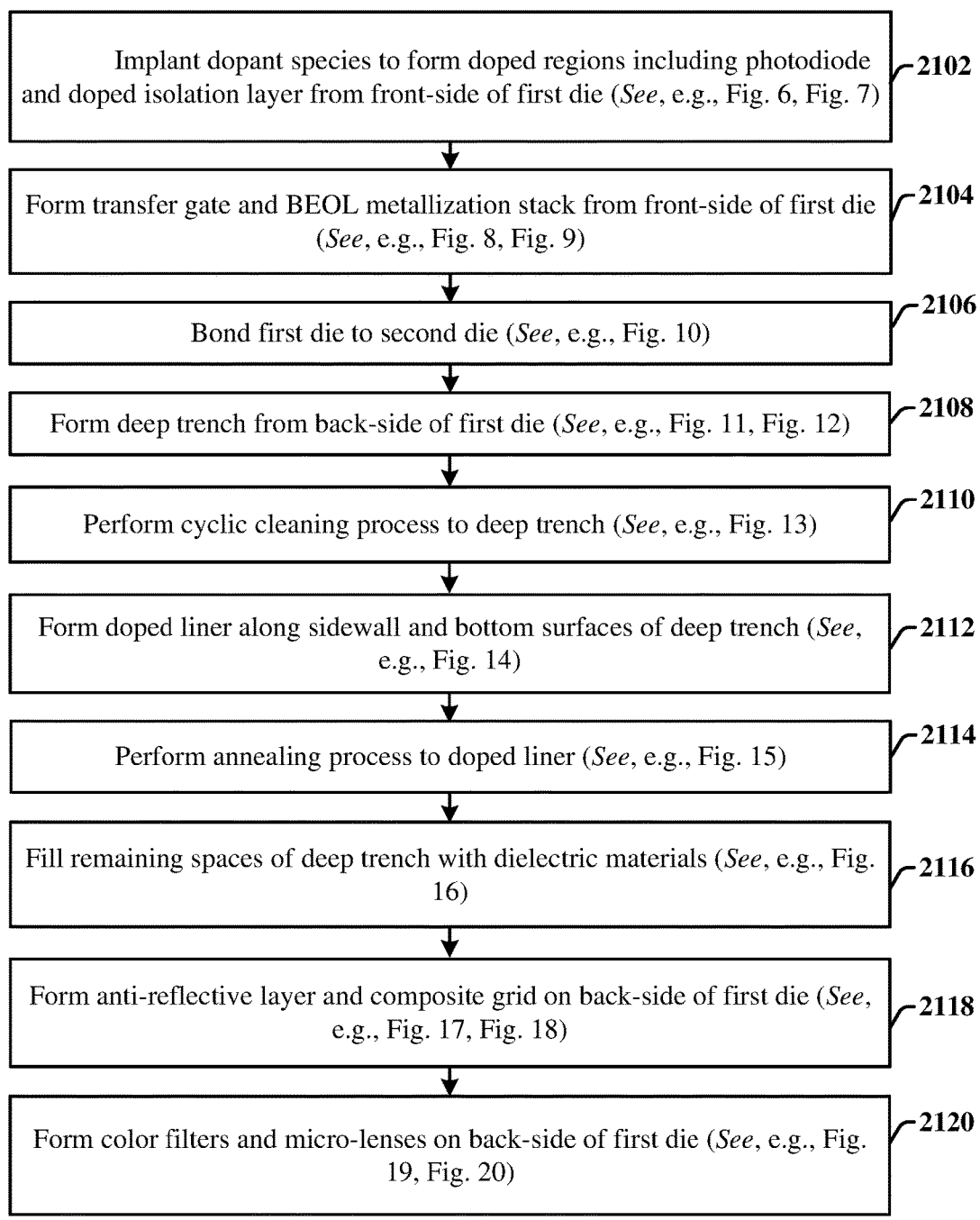
FIG. 21 illustrates a flow diagram of some embodiments of a method of forming an image sensor having a photodiode surrounded by a BDTI structure having a doped layer.

FIG. 21 illustrates a flow diagram of some embodiments of a method 2100 of forming an image sensor having a photodiode surrounded by a BDTI structure having a conformal doped layer.

While disclosed method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 2102, a substrate is prepared for an image sensing die. A photodiode and a doped isolation well are formed in the substrate from a front-side of the image sensing die. In some embodiments, an epitaxial layer is formed over a handling substrate as a photodiode doping layer, and photodiode doping columns and/or doped isolation wells may be formed by implanting dopant species into the epitaxial layer. The doped isolation wells may be formed by a selective implantation to form a plurality of columns extending into the photodiode doping layer. In some embodiments, a shallow trench isolation region may be formed within the front-side of the image sensing die by selectively etching the substrate to form shallow-trenches and subsequently forming a dielectric (e.g. an oxide) within the shallow-trenches. FIGS. 6-7 illustrate cross-sectional views corresponding to some embodiments corresponding to act 2102.

At act 2104, a transfer gate is formed on the front-side of the the image sensing die. A metallization stack is then formed over the transfer gate. FIGS. 8-9 illustrate cross-sectional views corresponding to some embodiments corresponding to act 2104.

At act 2106, in some embodiments, the image sensor is bonded to one or more other dies such as a logic die or other image sensing dies. FIG. 10 illustrates a cross-sectional view corresponding to some embodiments corresponding to act 2106.

At act 2108, the substrate is selectively etched to form deep trenches between adjacent sensing pixel regions and extending into the substrate from a back-side of the image sensing die. The deep trenches may have a center line aligned with that of the doped isolation well and/or the shallow trench isolation region. In some embodiments, the substrate is thinned before etching to form the deep trenches. A handling substrate may be partially or completely removed from the back-side of the image sensing die. FIGS. 11-12 illustrate cross-sectional views corresponding to some embodiments corresponding to act 2108.

At act 2110, a cyclic cleaning process is performed to the deep trenches. FIG. 13 illustrates a cross-sectional view corresponding to some embodiments corresponding to act 2110.

At act 2112, a doped liner is formed along sidewall and bottom of the deep trenches. In some embodiments, the doped liner can be formed by a low temperature epitaxial process. FIG. 14 illustrates a cross-sectional view corresponding to some embodiments corresponding to act 2112.

At act 2114, an annealing process is performed to facilitate dopant diffusion from the doped liner to underlying photodiode doping layer. FIG. 15 illustrates a cross-sectional view corresponding to some embodiments corresponding to act 2114.

At act 2116, remaining spaces of the deep trenches are filled with dielectric materials. A high-k dielectric liner may be formed within the deep trenches onto the doped liner. FIG. 16 illustrates a cross-sectional view corresponding to some embodiments corresponding to act 2116.

At act 2118, anti-reflective layer and composite grid are formed on the back side of the image sensing die. FIGS. 17-18 illustrate cross-sectional views corresponding to some embodiments corresponding to act 2118.

At act 2120, color filters and micro-lenses are formed on the back-side of the image sensing die. FIGS. 19-20 illustrate cross-sectional views corresponding to some embodiments corresponding to act 2120.

Therefore, the present disclosure relates to an image sensor having a photodiode surrounded by a BDTI structure, and an associated method of formation. The BDTI structure comprises a doped liner lining a sidewall surface of a deep trench and a dielectric layer filling a remaining space of the deep trench. By forming the disclosed BDTI structure that functions as a doped well and an isolation structure, the implantation processes from a front-side of the image sensing die is simplified, and thus the exposure resolution and the full well capacity of the photodiode are improved, and the blooming and crosstalk are reduced. By performing a cyclic cleaning process to remove a defective layer within a deep trench of the BDTI structure and then forming a thin epitaxial doped liner in the deep trench, a smooth interface is provided between the doped liner and the underlying photodiode doping layer, and thus white pixels and dark current are significantly reduced. In some further embodiments, the BDTI structure can be used beyond image sensors, such as a semiconductor device including a deep trench capacitor.

In some embodiments, the present disclosure relates to a method of forming an image sensor. A plurality of photodiodes is formed for a plurality of pixel regions from a front-side of an image sensing die. A photodiode is formed to have a photodiode doping column with a first doping type surrounded by a photodiode doping layer with a second doping type that is different than the first doping type. A deep trench is formed between adjacent pixel regions by etching the photodiode doping layer from a back-side of the image sensing die. An upper portion of the photodiode doping layer exposed to the deep trench is converted to a defective layer during the etching of the deep trench. A cyclic cleaning process of at least two different etchants is performed alternatively to remove the defective layer. A doped liner with the second doping type is formed lining a sidewall surface of the deep trench. A dielectric fill layer is formed filling an inner space of the deep trench to form a back-side deep trench isolation (BDTI) structure.

In some alternative embodiments, the present disclosure relates to method of forming an image sensor. The method comprises forming photodiodes for a plurality of pixel regions from a front-side of an image sensing die. A photodiode is formed to have a photodiode doping column with a first doping type surrounded by a photodiode doping layer with a second doping type that is different than the first doping type. A doped isolation well is formed from the front-side of the image sensing die by implanting dopants into the photodiode doping layer through a plurality of implanting processes. A gate structure and a metallization stack are formed on the front-side of the image sensing die, wherein the metallization stack comprises a plurality of metal interconnect layers arranged within one or more inter-level dielectric layers. The image sensing die is bonded to to a logic die from the front-side of the image sensing die, wherein the logic die comprises logic devices. A deep trench is formed between adjacent pixel regions by etching from a back-side of the image sensing die. A cyclic cleaning process of at least two different etchants is performed alternatively to remove an upper portion of the photodiode doping layer exposed to the deep trench. A doped liner with the second doping type is formed lining a sidewall surface of the deep trench. A dielectric fill layer is formed filling an inner space of the deep trench to form a back-side deep trench isolation (BDTI) structure.

In yet other embodiments, the present disclosure relates to an image sensor. The image sensor comprises an image sensing die having a front-side and a back-side opposite to the front-side. A plurality of pixel regions is disposed within the image sensing die and respectively comprises a photodiode configured to convert radiation that enters from the back-side of the image sensor die into an electrical signal. The photodiode comprises a photodiode doping column with a first doping type surrounded by a photodiode doping layer with a second doping type that is different than the first doping type. A BDTI structure is disposed between adjacent pixel regions and extending from the back-side of the image sensor die to a position within the photodiode doping layer. The BDTI structure comprises a doped liner with the second doping type and a dielectric fill layer, the doped liner lining a sidewall surface of the dielectric fill layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor, comprising:
    forming a plurality of photodiodes for a plurality of pixel regions from a front-side of an image sensing die, wherein a photodiode is formed to have a photodiode doping column with a first doping type surrounded by a photodiode doping layer with a second doping type that is different than the first doping type;
    forming a deep trench between adjacent pixel regions in the photodiode doping layer from a back-side of the image sensing die, wherein an upper portion of the photodiode doping layer exposed to the deep trench is converted to a defective layer during the forming of the deep trench;
    performing a cyclic cleaning process of at least two different etchants alternatively to remove the defective layer;
    forming a doped liner precursor with the second doping type lining a sidewall surface of the deep trench, the doped liner precursor having a thickness smaller than 10 nm and a doping concentration greater than $1\times10^{19}$cm−3;
    forming a doped liner by performing an annealing process to facilitate dopant diffusion from the doped liner precursor to an adjoining portion of the photodiode doping layer; and
    forming a dielectric fill layer filling an inner space of the deep trench to form a back-side deep trench isolation (BDTI) structure;
    wherein the doped liner is formed with a surface dopant concentration greater than $1\times10^{20}$cm−3 and a depth of 20 nm at which the dopant concentration is reduced to around $10^{15}$cm−3.

2. The method of claim 1, wherein performing the cyclic cleaning process comprises using solutions of hydrofluoric acid (HF) and ammonia and hydrogen peroxide mixtures (APM) alternatively for multiple cycles.

3. The method of claim 1, wherein the cyclic cleaning process removes at least about 1~20 nm of the upper portion of the photodiode doping layer.

4. The method of claim 1, wherein the doped liner precursor is formed by an epitaxial deposition process under a temperature lower than 500° C.

5. The method of claim 1, wherein the annealing process comprises multiple rounds of a dynamic surface anneal process.

6. The method of claim 1, wherein the cyclic cleaning process reduces a bowing angle of a bowing tip at a top corner of the deep trench to be smaller than 15° from an upper sidewall to a vertical line perpendicular to a lateral plane of the photodiode doping layer.

7. The method of claim 4, wherein the annealing process is a laser annealing process.

8. The method of claim 1, wherein a bowing width and a bowing angle of the deep trench are reduced by the cyclic cleaning process.

9. The method of claim 1, wherein the BDTI structure is formed through the photodiode doping layer.

10. The method of claim 1, wherein the doped liner is formed to reach on a surface of a doped isolation well.

11. A method of forming an image sensor, comprising:
forming photodiodes for a plurality of pixel regions from a front-side of an image sensing die, wherein a photodiode is formed to have a photodiode doping column with a first doping type surrounded by a photodiode doping layer with a second doping type that is different than the first doping type;
forming a doped isolation well from the front-side of the image sensing die by implanting dopants into the photodiode doping layer through at least one implanting process;
forming a gate structure and a metallization stack on the front-side of the image sensing die, wherein the metallization stack comprises a plurality of metal interconnect layers arranged within one or more inter-level dielectric layers;
bonding the image sensing die to a logic die from the front-side of the image sensing die, wherein the logic die comprises logic devices;
forming a deep trench between adjacent pixel regions in a back-side of the image sensing die;
performing a cyclic cleaning process to remove an upper portion of the photodiode doping layer exposed to the deep trench;
forming a doped liner with the second doping type lining a sidewall surface of the deep trench; and
forming a dielectric fill layer filling an inner space of the deep trench to form a back-side deep trench isolation (BDTI) structure;
wherein the cyclic cleaning process reduces a bowing angle of a bowing tip at a top corner of the deep trench to be smaller than 15° from an upper sidewall to a vertical line perpendicular to a lateral plane of the photodiode doping layer.

12. The method of claim 11, wherein performing the cyclic cleaning process comprises using solutions of hydrofluoric acid (HF) and ammonia and hydrogen peroxide mixtures (APM) alternatively for multiple cycles.

13. The method of claim 11, further comprising:
forming a shallow trench isolation (STI) structure between the adjacent pixel regions from the front-side of the image sensing die to a position within the photodiode doping layer;
wherein the deep trench is formed to expose the STI structure.

14. The method of claim 11, wherein the deep trench is formed to expose the doped isolation well.

15. A method of forming an image sensor, comprising:
preparing an image sensing die having a front-side and a back-side opposite to the front-side;
forming a plurality of pixel regions within the image sensing die and respectively comprising a photodiode including a photodiode doping column with a first doping type surrounded by a photodiode doping layer with a second doping type that is different than the first doping type; and
forming a deep trench between adjacent pixel regions in the photodiode doping layer from the back-side of the image sensing die, wherein an upper portion of the photodiode doping layer exposed to the deep trench is converted to a defective layer during the forming of the deep trench;
performing a cyclic cleaning process of at least two different etchants alternatively to remove the defective layer;
forming a doped liner precursor with the second doping type lining a sidewall surface of the deep trench, the doped liner precursor having a thickness smaller than 10 nm and a doping concentration greater than $1 \times 10^{19} cm-3$;
forming a doped liner by performing an annealing process to facilitate dopant diffusion from the doped liner precursor to an adjoining portion of the photodiode doping layer; and
forming a dielectric fill layer filling an inner space of the deep trench to form a back-side deep trench isolation (BDTI) structure;
wherein a bowing width and a bowing angle of the deep trench are reduced by the cyclic cleaning process.

16. The method of claim 15,
wherein the doped liner and the dielectric fill layer of the BDTI structure extend laterally along the back-side of the image sensing die; and
wherein a lateral portion of the doped liner is formed overlying the photodiode doping column.

17. The method of claim 15, further comprising:
forming a doped isolation well with the second doping type between the adjacent pixel regions and extending from the front-side of the image sensing die to a position within the photodiode doping layer;
wherein the doped isolation well directly contacts the BDTI structure.

18. The method of claim 15, further comprising:
forming a shallow trench isolation (STI) structure between the adjacent pixel regions from the front-side of the image sensing die to a position within the photodiode doping layer.

19. The method of claim 18, wherein the BDTI structure extends through the STI structure.

20. The method of claim 15, wherein the bowing width is of about 10 nm, and the bowing angle is in a range of about 8° to 15° from an upper sidewall of the BDTI structure to a vertical line perpendicular to a lateral plane of the photodiode doping layer.

* * * * *